(12) United States Patent
Kato et al.

(10) Patent No.: US 12,213,312 B2
(45) Date of Patent: Jan. 28, 2025

(54) SEMICONDUCTOR STORAGE DEVICE

(71) Applicant: Kioxia Corporation, Tokyo (JP)

(72) Inventors: Kaihei Kato, Yokkaichi Mie (JP); Takashi Fukushima, Yokkaichi Mie (JP); Kazutaka Suzuki, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 35 days.

(21) Appl. No.: 18/305,685

(22) Filed: Apr. 24, 2023

(65) Prior Publication Data

US 2023/0262973 A1 Aug. 17, 2023

Related U.S. Application Data

(63) Continuation of application No. 17/007,675, filed on Aug. 31, 2020, now Pat. No. 11,672,113.

(30) Foreign Application Priority Data

Nov. 26, 2019 (JP) .................................. 2019-213410

(51) Int. Cl.
| | |
|---|---|
| H10B 43/50 | (2023.01) |
| G11C 5/02 | (2006.01) |
| G11C 5/06 | (2006.01) |
| H10B 41/27 | (2023.01) |
| H10B 43/27 | (2023.01) |

(52) U.S. Cl.
CPC ............ *H10B 41/27* (2023.02); *G11C 5/025* (2013.01); *G11C 5/06* (2013.01); *H10B 43/27* (2023.02); *H10B 43/50* (2023.02)

(58) Field of Classification Search
None
See application file for complete search history.

(56) References Cited

U.S. PATENT DOCUMENTS

| | | |
|---|---|---|
| 9,853,038 B1 | 12/2017 | Cui |
| 10,192,929 B2 | 1/2019 | Mori |
| 2017/0133397 A1 | 5/2017 | Lee |
| 2017/0358590 A1 | 12/2017 | Kang et al. |
| 2019/0259773 A1 | 8/2019 | Wang |
| 2021/0118902 A1 | 4/2021 | Kanamori et al. |

FOREIGN PATENT DOCUMENTS

| | | |
|---|---|---|
| CN | 110176452 A | 8/2019 |
| JP | 2018-046167 A | 3/2018 |
| WO | WO-2019/160593 A1 | 8/2019 |

*Primary Examiner* — Sarah K Salerno
(74) *Attorney, Agent, or Firm* — Foley & Lardner LLP

(57) ABSTRACT

A semiconductor storage device includes a substrate having a surface, a first conductive layer 25 disposed on a substrate and extending in an X direction parallel to the surface of the substrate; a second conductive layer 25 that disposed on the first conductive layer 25 and extending in the X direction; an insulation plug 30 disposed on the substrate, extends in a Z direction intersecting with the X direction, and intersects with the first conductive layer 25; and a contact plug CC disposed on the first insulation plug 30, extends in the Z direction, and intersects with the second conductive layer 25.

20 Claims, 37 Drawing Sheets

SEMICONDUCTOR STORAGE DEVICE

CROSS-REFERENCE TO RELATED APPLICATION

This application is a continuation of U.S. patent application Ser. No. 17/007,675, filed Aug. 31, 2020, which is based upon and claims the benefit of priority from Japanese Patent Application No. 2019-213410, filed Nov. 26, 2019, the entire contents of which are incorporated here by reference.

FIELD

Embodiments described herein relate to a semiconductor storage device.

BACKGROUND

A semiconductor storage device in which memory cells are three-dimensionally arranged is known.

DETAILED DESCRIPTION

Figure 1:
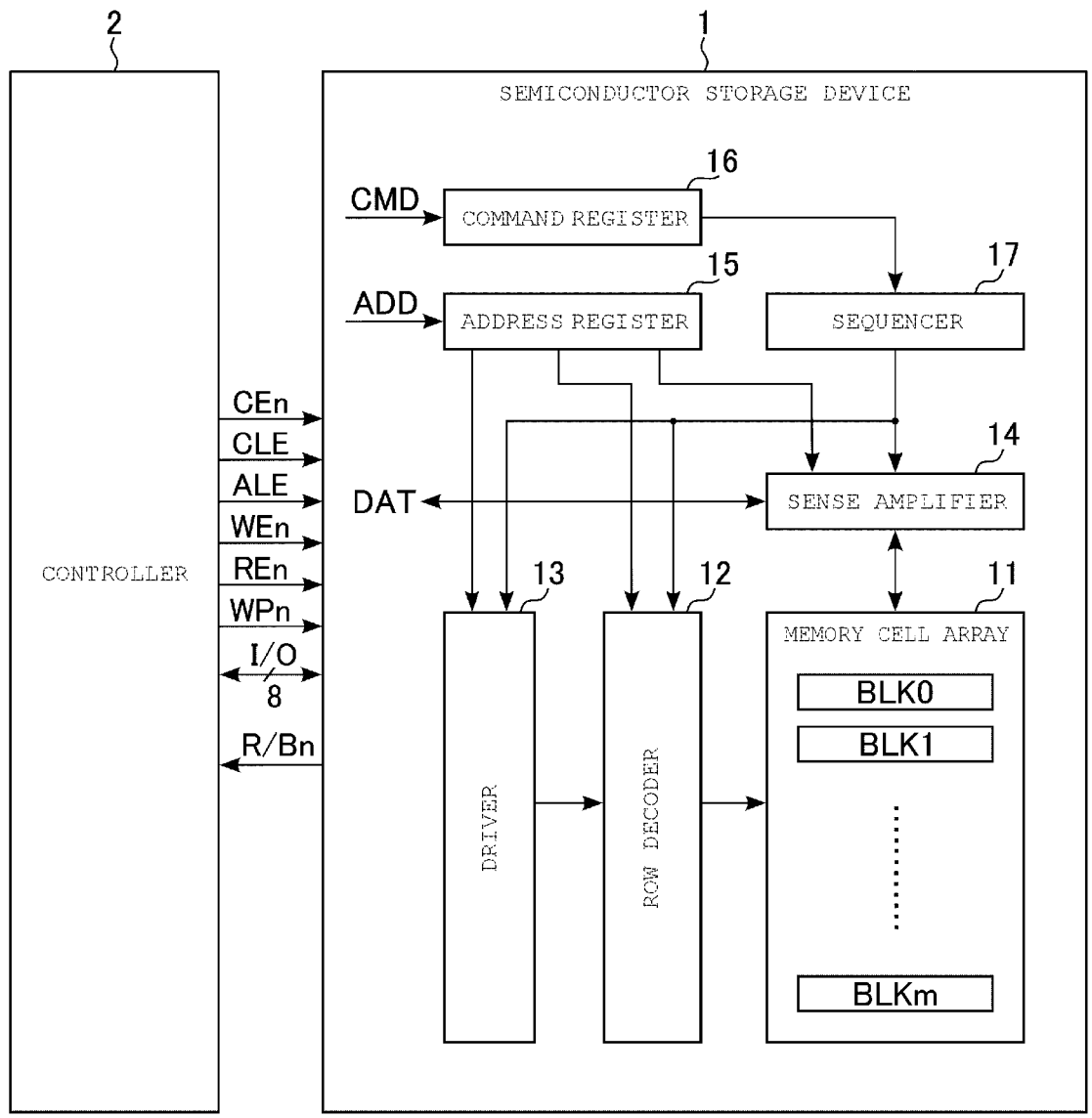
FIG. 1 is a block diagram showing a circuit configuration of a semiconductor storage device according to a first embodiment.

Provided, according to at least one embodiment, is a semiconductor storage device capable of improving operation reliability.

A semiconductor storage device according to least one embodiment includes: a substrate having a surface, a first conductive layer disposed on the substrate and extending in a first direction parallel to the surface of the substrate; a second conductive layer disposed on the first conductive layer and extending in the first direction; a first insulation plug disposed on the substrate, extending in a second direction intersecting with the first direction, and intersecting with the first conductive layer; and a contact plug disposed on the first insulation plug, extending in the second direction, and intersecting with the second conductive layer.

Hereinafter, embodiments will be described with reference to the drawings. In the following description, components having the same functions and configurations are represented by the same reference numerals. Further, each of the embodiments described below exemplifies a device and a method for embodying the technical idea of this embodiment, and the material, shape, structure, arrangement, and the like of the components are not specified to those of the following description.

Each functional block may be implemented by hardware, computer software, or a combination of both. It is not essential that each functional block is distinguished as in the example below. For example, some functions may be executed by a functional block different from the exemplified functional block. Furthermore, the exemplified functional block may be divided into smaller functional sub-blocks. Here, as the nonvolatile semiconductor memory, a three-dimensional stacked NAND flash memory in which memory cell transistors are stacked above a semiconductor substrate will be described as an example.

1. First Embodiment

The semiconductor storage device according to the first embodiment will be described below.

1.1 Circuit Configuration of Semiconductor Storage Device

First, the circuit block configuration of the semiconductor storage device according to the first embodiment will be described with reference to FIG. 1. FIG. 1 is a block diagram showing the circuit configuration of the semiconductor storage device of the first embodiment. The semiconductor storage device 1 includes a memory cell array 11, a row decoder 12, a driver 13, a sense amplifier 14, an address register 15, a command register 16, and a sequencer 17. Further, for example, the semiconductor storage device 1 is externally connected to the controller 2 via a NAND bus. The controller 2 accesses the semiconductor storage device 1 and controls the semiconductor storage device 1.

1.1.1 Structure of Each Block

The memory cell array 11 includes a plurality of blocks BLK0, BLK1, BLK2, . . . BLKm (m is a natural number of 0 or more) including a plurality of nonvolatile memory cells associated with rows and columns. In the following description, "block BLK" may refer to each of the blocks BLK0 to BLKm or a specific block BLK. The memory cell array 11 stores the data given from the controller 2. Details of the memory cell array 11 and the block BLK will be described later.

The row decoder 12 selects one of the blocks BLK and further selects a word line in the selected block BLK.

The driver 13 supplies a voltage to the selected block BLK via the row decoder 12.

The sense amplifier 14 transfers the write data DAT received from the controller 2 to the memory cell array 11 during a data write operation. The sense amplifier 14 senses the data DAT read from the memory cell array 11 during a data read operation and performs a necessary calculation. Further, the data DAT is output to the controller 2.

The address register 15 stores the address ADD received from the controller 2. The address ADD includes a block address that specifies the block BLK to be operated and a page address that specifies the word line to be operated in the specified block. The command register 16 stores the command CMD received from the controller 2. The command CMD may include, for example, a write command for instructing the sequencer 17 to perform a write operation and a read command for instructing the sequencer 17 to a read operation.

The sequencer 17 controls the operation of the semiconductor storage device 1 based on the command CMD stored in the command register 16. Specifically, the sequencer 17 controls the row decoder 12, the driver 13, and the sense amplifier 14 based on the write command stored in the command register 16 so as to perform writing on the plurality of memory cell transistors specified by the address ADD. The sequencer 17 also controls the row decoder 12, the driver 13, and the sense amplifier 14 based on the read command stored in the command register 16 so as to perform reading from the plurality of memory cell transistors specified by the address ADD.

As described above, the semiconductor storage device 1 is connected to the controller 2 via the NAND bus. The NAND bus transmits and receives signals according to the NAND interface. Specifically, the NAND bus includes, for example, a chip enable signal CEn, a command latch enable signal CLE, an address latch enable signal ALE, a write enable signal WEn, a read enable signal REn, a write protect signal WPn, an input/output signal I/O, and a bus for communicating ready/busy signals R/Bn. The input/output signal I/O is transmitted with a bus width of 8 bits. The input/output signal I/O communicates the command CMD, the address ADD, the data DAT and the like. It is noted that "n" added to the signal name indicates that the signal is active low.

1.1.2 Circuit Configuration of Memory Cell Array 11

As described above, the memory cell array 11 includes the blocks BLK0 to BLKm. Each of the blocks BLK0 to BLKm has the same configuration. The circuit configuration of one block BLK will be described below.

Figure 2:
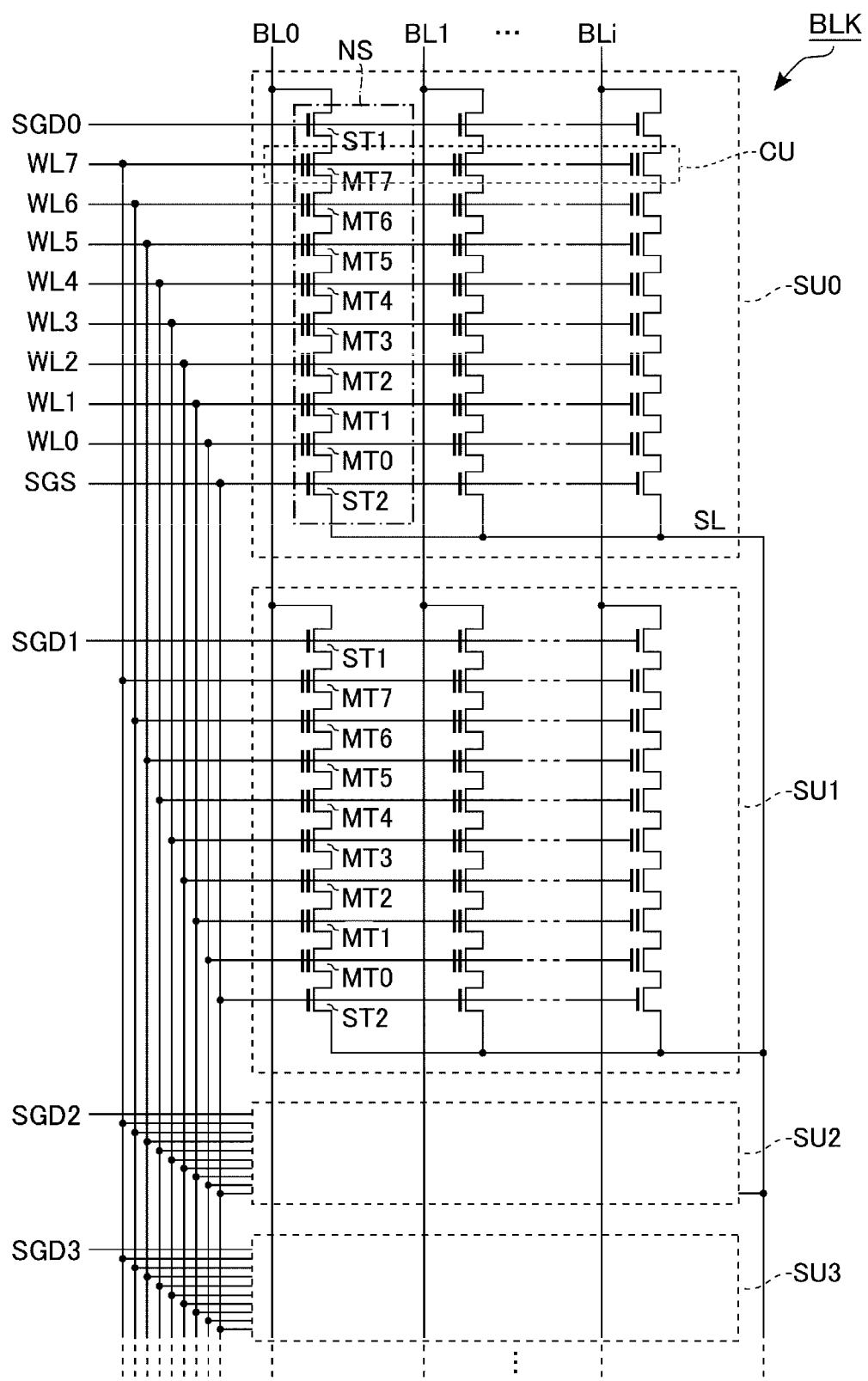
FIG. 2 is a circuit diagram of a block in a memory cell array in the semiconductor storage device of the first embodiment.

FIG. 2 is a circuit diagram of the block BLK in the memory cell array 11. As shown, the block BLK includes, for example, four string units SU0 to SU3. Hereinafter, when the string unit SU is described, the string unit SU means each of the string units SU0 to SU3. The string unit SU includes a plurality of NAND strings NS.

Each of the NAND strings NS includes, for example, eight memory cell transistors MT0 to MT7 and select transistors ST1 and ST2. Hereinafter, the memory cell transistor MT will be referred to as each of the memory cell transistors MT0 to MT7. A memory cell transistor (hereinafter also referred to as a memory cell) MT includes a control gate and a charge storage layer, and stores data in a nonvolatile manner. The memory cell transistor MT is connected in series between the source of the select transistor ST1 and the drain of the select transistor ST2.

The gate of the select transistor ST1 in each of the string units SU0 to SU3 is connected to each of the select gate lines SGD0 to SGD3. In contrast, the gate of the select transistor ST2 in each of the string units SU0 to SU3 is connected to, for example, one select gate line SGS. The control gates of the memory cell transistors MT0 to MT7 in the string units SU0 to SU3 in the block BLK are connected to the word lines WL0 to WL7, respectively.

The memory cell array 11 also shares the bit lines BL0 to BLi among the plurality of blocks BLK0 to BLKm. However, i is a natural number of 0 or more. In the plurality of string units SU0 to SU3 in the block BLK, each bit line BL is commonly connected to the drains of the select transistors ST1 of the NAND strings NS in the same column. That is, each bit line BL connects the NAND strings NS in common among the plurality of string units SU0 to SU3 in the same column. Further, the sources of the plurality of select transistors ST2 are commonly connected to the source line SL. That is, the string unit SU includes a plurality of NAND strings NS connected to different bit lines BL and the same select gate line SGD.

The block BLK also includes a plurality of string units SU that share the word line WL.

The plurality of memory cell transistors MT connected to the common word line WL in the string unit SU is referred to as a cell unit CU. The storage capacity of the cell unit CU changes in accordance with the number of bits of data stored in the memory cell transistor MT. For example, the cell unit CU stores 1 page data when each memory cell transistor MT stores 1 bit data, stores 2 page data when each memory cell transistor MT stores 2 bit data, and stores 3 page data when each memory cell transistor MT stores 3 bit data.

The configuration of the memory cell array 11 is not limited to the above configuration, however. For example, the number of the string units SU in each block BLK may be set freely. The number of the memory cell transistors MT in each NAND string NS and the number of the select transistors ST1 and ST2 in each NAND string NS may be set freely.

1.2 Structure of Semiconductor Storage Device

Next, the structure of the semiconductor storage device 1 of the first embodiment will be described.

1.2.1 Planar Layout of Semiconductor Storage Device

Figure 3:
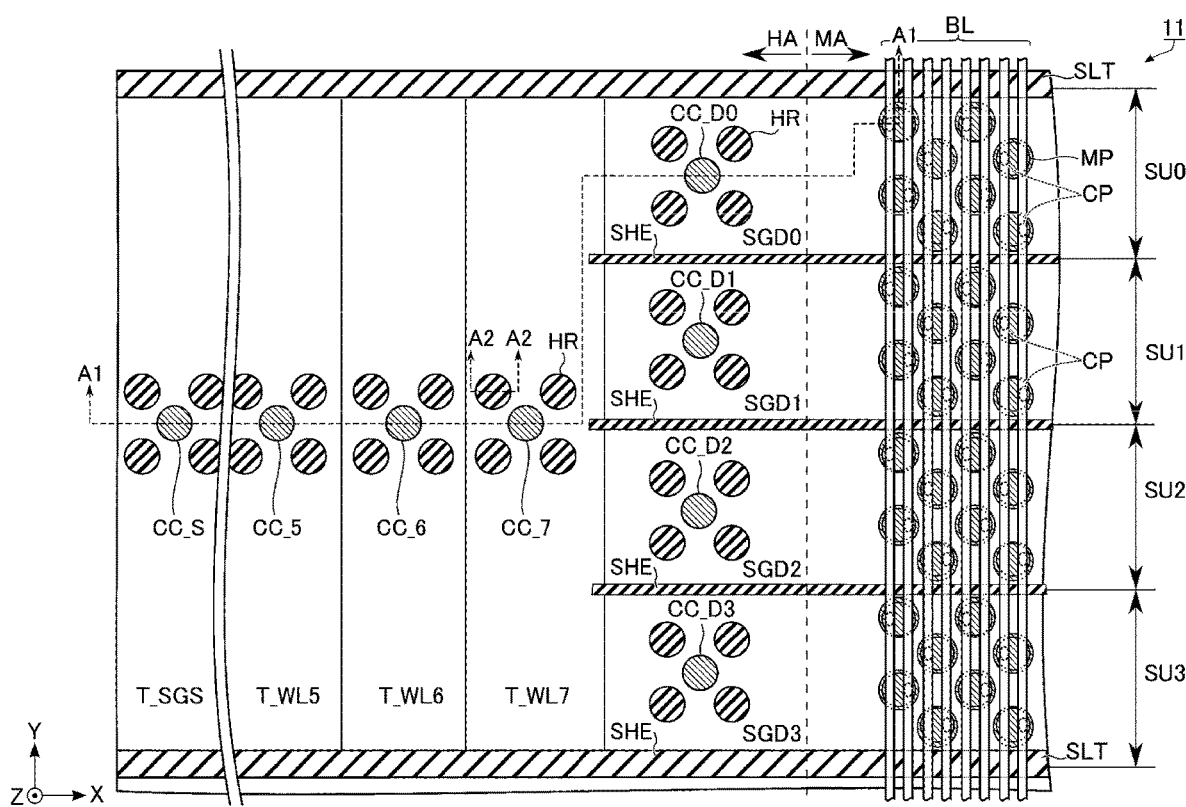
FIG. 3 is a diagram showing a planar layout of a memory cell array in the semiconductor storage device of the first embodiment.

An example of a planar layout in the memory cell array 11 of the semiconductor storage device 1 will be described with reference to FIG. 3. FIG. 3 is a diagram showing a planar layout in the memory cell array 11 of the semiconductor storage device 1. In FIG. 3, two directions orthogonal to (or intersecting with) each other and parallel to the semiconductor substrate surface are defined as an X direction and a Y direction, and a direction orthogonal to (or intersecting with) the X direction and the Y direction (XY plane) is defined as a Z direction.

A plurality of blocks BLK in the memory cell array 11 are separated by slits SLT, and one block BLK is provided between the slits SLT. The layout of FIG. 3 shows the string units SU0 to SU3 in one block BLK and is divided into a memory array area MA and a hook-up area HA.

In the memory array area MA, memory cell transistors corresponding to the string units SU0 to SU3 are provided. In the hook-up area HA, a contact plug CC for connecting the stacked wiring layer (or stacked conductive layer) corresponding to the string units SU0 to SU3 to the upper layer wiring is provided. The contact plug CC includes each of CC_D0 to CC_D3, CC_0 to CC_7, and CC_S. When the contact plug CC is described, the contact plug CC indicates each of the contact plugs CC_D0 to CC_D3, CC_0 to CC_7, and CC_S.

As shown in FIG. 3, the memory cell array 11 includes, for example, a plurality of slits SLT, slits SHE, memory pillars MP, contact plugs CP, bit lines BL, a plurality of contact plugs CC, support columns HR, and a stacked wiring layer. The plurality of memory pillars MP, contact plugs CP, and bit lines BL are provided in the memory array area MA. The plurality of contact plugs CC and the support column HR are provided in the hook-up area HA.

The plurality of stacked wiring layers include, for example, one layer of select gate lines SGD (including SGD0 to SGD3), eight layers of word lines WL0 to WL7, and one layer of select gate lines SGS. The plurality of stacked wiring layers are stacked in the Z direction in the order of the select gate line SGS, the word lines WL0 to WL7, and the select gate line SGD from the semiconductor substrate side.

The plurality of slits SLT each are stretched in the X direction and are arranged in the Y direction orthogonal to the X direction. The plurality of slits SHE each also are stretched in the X direction and are arranged in the Y direction between adjacent slits SLT. The width of the slit SLT is wider than the width of the slit SHE, for example. The slits SLT and SHE each include an insulating layer.

The slit SLT divides, for example, the stacked wiring layer corresponding to the word line WL, the select gate line SGD, and the select gate line SGS. That is, the slit SLT insulates and separates the string units SU0 to SU3 from other string units (not shown) adjacent to the string units SU0 to SU3. The slit SHE divides the wiring layer corresponding to the select gate line SGD into the select gate lines SGD0 to SGD3 respectively corresponding to the string units SU0 to SU3 so as to separate and insulate the select gate lines SGD0 to SGD3.

In this way, the areas divided by the slits SLT and SHE constitute the respective string units SU0 to SU3. The entire memory cell array 11 has a configuration in which the layout shown in FIG. 3 is repeatedly arranged in the Y direction.

The plurality of memory pillars MP in the memory array area are arranged in, for example, 16 lines in a staggered manner in the area between the adjacent slits SLT. That is, in each of the string units SU0 to SU3, the plurality of memory pillars MP are arranged in four lines in a staggered manner.

A plurality of bit lines BL each are stretched in the Y direction and are arranged in the X direction. Each bit line BL overlaps with at least one memory pillar MP for each string unit SU as viewed from the Z direction, and two bit lines BL overlap with each memory pillar MP. A contact plug CP is provided between the memory pillar MP and one bit line BL overlapping the memory pillar MP. The string unit SU is electrically connected to the corresponding bit line BL via the contact plug CP on the memory pillar MP.

In the hook-up area HA, the select gate line SGD, the word lines WL7 to WL0, and the select gate line SGS have a staircase shape along the X direction. That is, as viewed from the Z direction, the word line WL7 has an area (hereinafter, referred to as a terrace area) T_WL7 which is longer than the select gate line SGD by a predetermined distance in the X direction and does not overlap with the select gate line SGD. The word line WL6 has a terrace area T_WL6 which is longer than the word line WL7 by a predetermined distance in the X direction and does not overlap the terrace area T_WL7 of the word line WL7. Similarly, the word lines WL5 to WL0 and the select gate line SGS are respectively longer than the word lines WL6 to WL0 by a predetermined distance in the X direction, and respectively have terrace areas T_WL5 to T SGS which does not overlap with the terrace areas T_WL6 to T_WL0 of the word lines WL6 to WL0.

The contact plugs CC_D0 to CC_D3 are provided on the select gate lines SGD0 to SGD3. The contact plugs CC_0 to CC_7 are provided on the terrace areas T_WL0 to T_WL7 of the word lines WL0 to WL7, respectively. Further, the contact plug CC_S is provided on the terrace area T SGS of the select gate line SGS.

The contact plugs CC_D0 to CC_D3 come into contact with, and are electrically connected to, the respective side surfaces of the wiring layers of the select gate lines SGD0 to SGD3. Each of the contact plugs CC_0 to CC_7 comes into contact with and is electrically connected to each side surface of the wiring layers of the word lines WL0 to WL7. Further, the contact plug CC_S comes into contact with and is electrically connected to the side surface of the wiring layer of the select gate line SGS.

An insulation plug (not shown) is provided on a lower layer of each contact plug CC. That is, each insulation plug is provided between each contact plug CC and the semiconductor substrate. Details of the contact plug CC and the insulation plug will be described later.

For example, the support column HR is disposed around the contact plug CC so as to surround the contact plug CC. The support column HR is an insulator that supports the multi-layer structure such that the multi-layer structure in the hook-up area HA does not collapse in the word line manufacturing process. Details of the support columns HR will be described later.

The planar layout of the memory cell array 11 described above is merely an example, and the present disclosure is not so limited. For example, the number of slits SHE and the number of string units SU arranged between the adjacent slits SLT may be set freely. Further, the number and arrangement of the memory pillars MP, the number and arrangement of the bit lines BL connected to the memory pillars MP, and the like may be set freely.

1.2.2 Cross-Sectional Structure of Semiconductor Storage Device

Figure 4:
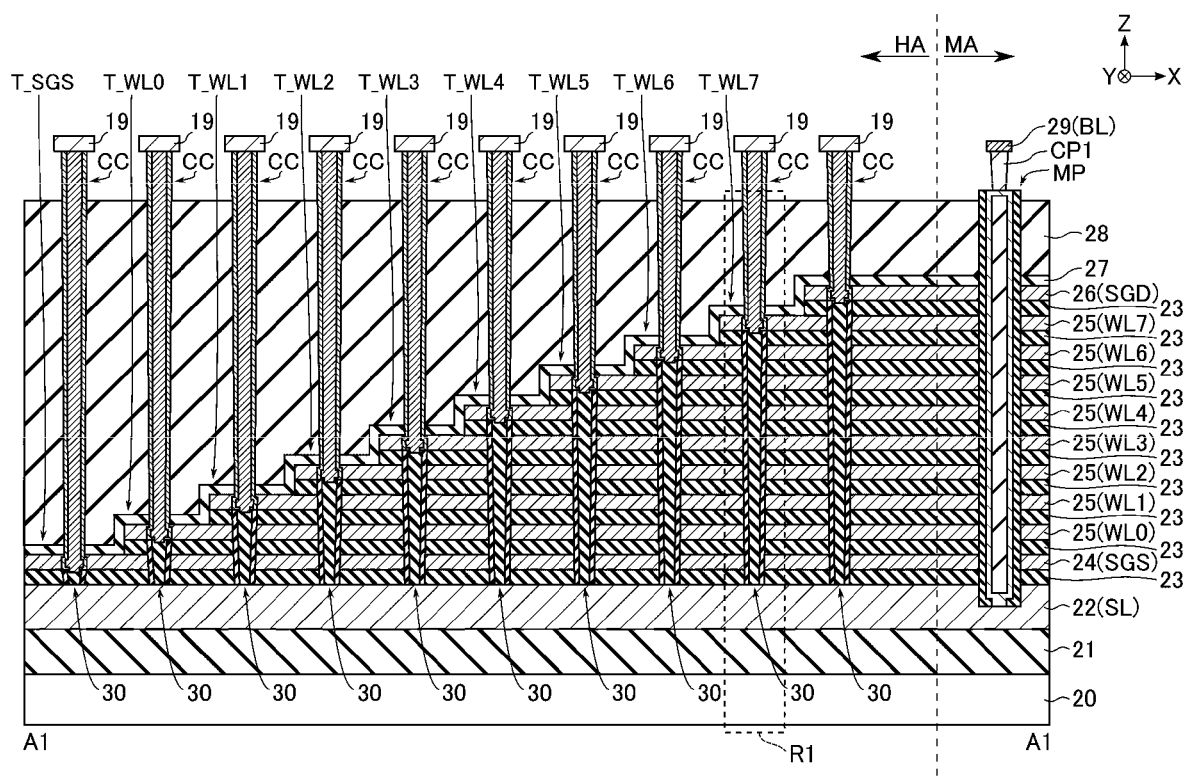
FIG. 4 is a cross-sectional view of a hook-up area and a memory array area in the semiconductor storage device of the first embodiment.
Figure 5:
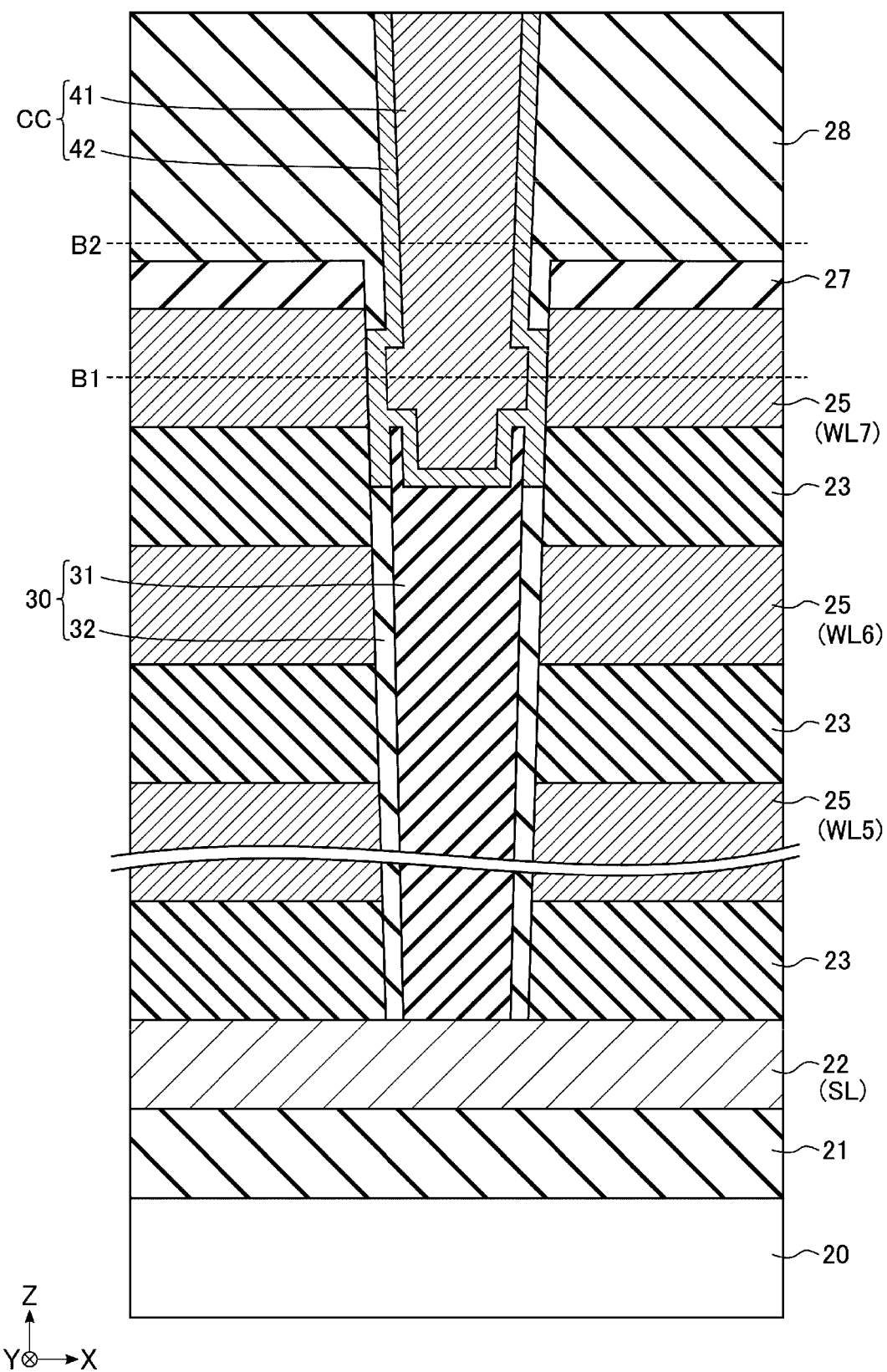
FIG. 5 is a cross-sectional view of a contact plug and an insulation plug in the semiconductor storage device of the first embodiment.

Next, the cross-sectional structure of the memory cell array 11 in the semiconductor storage device 1 of the first embodiment will be described. FIG. 4 is a cross-sectional view taken along the line A1-A1 in FIG. 3, and shows a cross section of the hook-up area HA and the memory array area MA. FIG. 5 is an enlarged view within the broken line R1 in FIG. 4, and shows a cross section of the contact plug CC and an insulation plug 30 in the hook-up area HA.

1.2.2.1 Cross-Sectional Structure of Hook-Up Area

As shown in FIG. 4, an insulating layer 21 is provided on a semiconductor substrate 20, and a conductive layer 22 is provided on the insulating layer 21. A stacked body in which an insulating layer 23, a conductive layer 24, a plurality of conductive layers 25, and a conductive layer 26 are alternately stacked is provided on the conductive layer 22.

The conductive layers 22, 24, 25, and 26 each have a plate shape along (or are parallel to) the XY plane (or a plane of the semiconductor substrate 20). The conductive layers 22, 24, 25, 26 and the insulating layer 23 are stretched in (extend in) the X direction from the memory array area MA to the hook-up area HA. As described above, the conductive layers 22, 24, 25, and 26 each have a terrace area that does not overlap with the upper conductive layer, and are provided in a stepwise manner in the X direction as shown in FIG. 4. An insulating layer 27 is provided on the terrace areas of the conductive layers 24 and 25 and on the conductive layer 26. Further, an insulating layer 28 is provided on the insulating layer 27.

The conductive layer 22 functions as the source line SL. The conductive layer 24 functions as the select gate line SGS. The conductive layer 25 functions as each of a plurality of word lines WL0 to WL7. The conductive layer 26 functions as the select gate line SGD. The conductive layers 22, 24, 25, and 26 include, for example, tungsten (W) or polycrystalline silicon. The semiconductor substrate 20 includes, for example, a silicon substrate and an epitaxial layer of silicon.

As shown in FIG. 4, in each of the terrace areas T_WL7 to T_WL0 and T SGS, an insulation plug 30 stretched in the Z direction inside the conductive layers 24 and 25 and the insulating layer 23 is provided. Similarly, in an area corresponding to the terrace area of the conductive layer 26, the insulation plugs 30 stretched in the Z direction inside the conductive layers 24 and 25 and the insulating layer 23 are provided. The insulation plug 30 has a columnar body shape stretched in the Z direction, and reaches (extends) from the upper surface of the insulating layer 23 as the uppermost layer in the terrace area (or lower layer of the conductive layer 26) to the insulating layer 23 as the lowermost layer or the conductive layer 22.

The conductive layer 25 (or 24, 26) and the contact plug CC stretched in the Z direction in the insulating layers 23, 27, 28 are provided on the insulation plug 30 in the terrace area. The contact plug CC has a columnar body shape stretched in the Z direction, and reaches from the upper surface of the insulating layer 28 to the conductive layers 25 (or 24, 26) in the terrace area and the upper surface of the insulation plug 30.

As shown in FIG. 5, the insulation plug 30 has an insulating layer 31, and an insulating layer 32 provided on the outer periphery of the insulating layer 31. More specifically, the insulating layer 31 is provided on the inner wall of the hole that provides the insulation plug 30, and the insulating layer 32 is provided on the inner wall of the insulating layer 31. For example, the insulating layer 31 includes a silicon nitride layer and the insulating layer 32 includes a silicon oxide layer.

The contact plug CC has a conductive layer 41 and a conductive layer 42 provided on the outer periphery of the conductive layer 41. More specifically, the conductive layer 42 is provided on the inner wall of the hole to provide the contact plug CC, and the conductive layer 41 is provided on the inner wall of the conductive layer 42. The conductive layer 42 comes into contact with the side surface of the conductive layer 25 (or 24, 26) as the uppermost layer in the terrace area and is electrically connected to the conductive layer 25 (or 24, 26). The conductive layer 19 is provided on the contact plug CC. The conductive layer 19 is electrically connected to the row decoder 12, for example. As a result, the conductive layer 25 (or 24, 26) is electrically connected to the row decoder 12 via the contact plug CC and the conductive layer 19. It is noted that, for example, the conductive layer 41 includes tungsten (W), and the conductive layer 42 includes a barrier metal such as titanium nitride (TiN).

Next, the structure of the contact plug CC in the first embodiment will be described in detail with reference to FIG. 5. As shown in FIG. 5, for example, the conductive layer 25 (WL6) is stretched in the X direction parallel to the surface of the semiconductor substrate 20. The conductive layer 25 (WL7) is provided on the conductive layer 25 (WL6) and is stretched in the X direction. The insulation plug 30 is provided on the semiconductor substrate 20, is stretched in the Z direction intersecting with the X direction, and intersects with the conductive layer 25 (WL6). The contact plug CC is provided on the insulation plug 30, is stretched in the Z direction, and intersects with the second conductive layer 25 (WL7).

In other words, the insulation plug 30 is provided on the semiconductor substrate 20 and is stretched in the Z direction intersecting with the surface of the semiconductor substrate 20. The contact plug CC is provided on the insulation plug 30 and is stretched in the Z direction. The conductive layer 25 (WL6) is provided around the insulation plug 30 on the semiconductor substrate 20 and is stretched in the X direction parallel to the surface of the semiconductor substrate 20. The conductive layer 25 (WL7) may be provided around the contact plug CC on the conductive layer 25 (WL6) and is stretched in the X direction.

A cross section along the X direction (for example, a cross section along the B1 line) in the first portion of the contact plug CC that intersects with the conductive layer 25 (WL7) is referred to as a first cross section. A cross section along the X direction (for example, a cross section along the line B2) in the second portion of the contact plug CC above the conductive layer 25 (WL7) is referred to as a second cross section. For this arrangement, the diameter of the first cross section is greater than the diameter of the second cross section.

In the area where the insulation plug 30 and the contact plug CC come into contact with each other, the insulation plug 30 has a first portion which has a surface along the X direction, and a second portion which is stretched from the first portion in the Z direction and extends inside the contact plug CC.

Figure 6:
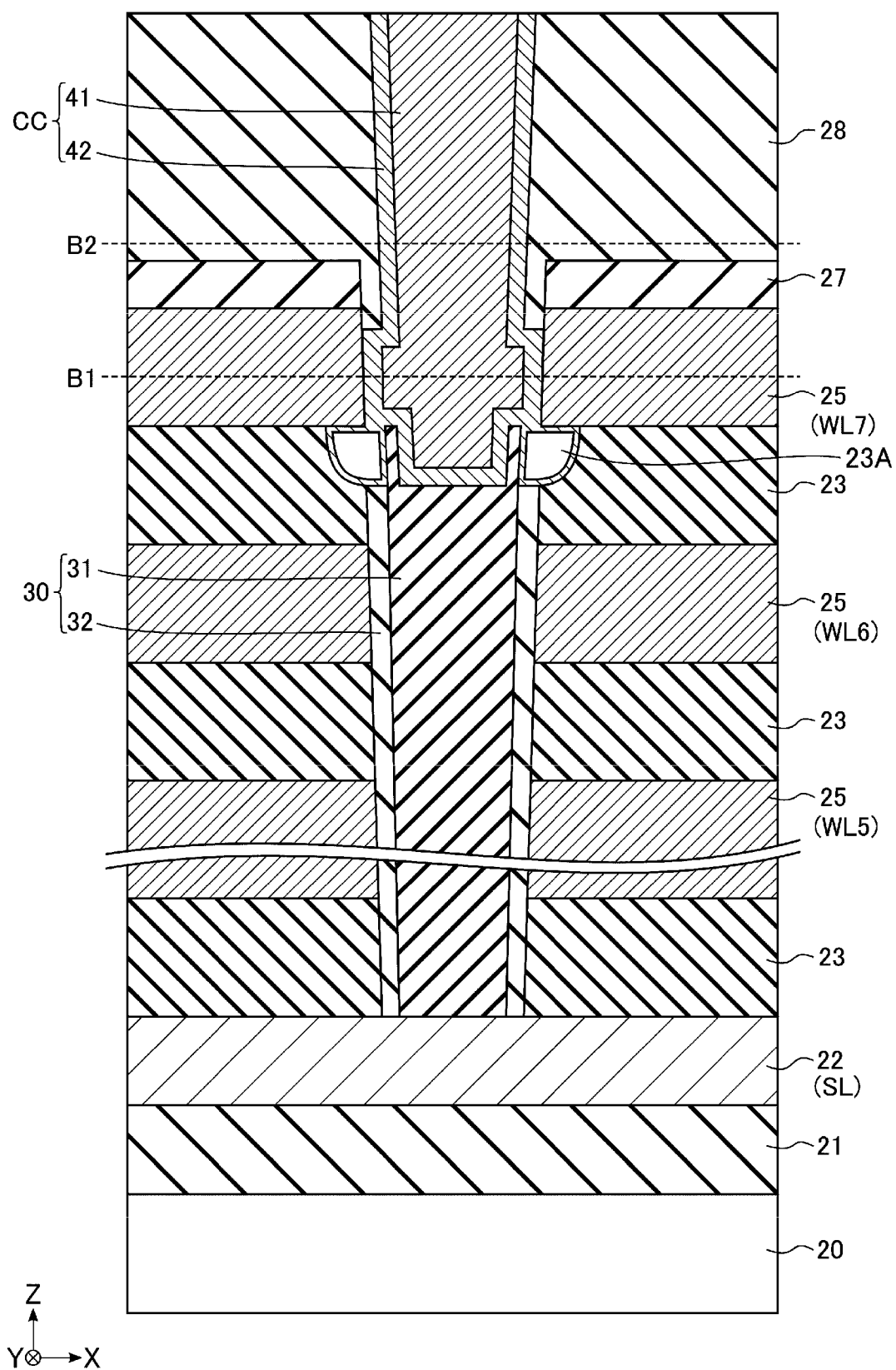
FIG. 6 is a cross-sectional view of a contact plug and an insulation plug of a modification example of the semiconductor storage device of the first embodiment.

Next, a modified contact plug CC will be described with reference to FIG. 6. In the structure shown in FIG. 5, the conductive layer 42 between the insulating layer 31 and the insulating layer 23 is formed in a shape of a substantially straight line in the Z direction. However, in the process of forming the contact plug CC, when the insulating layer 32 on the side surface of the conductive layer 25 is removed, the side surface of the insulating layer 23 between the conductive layers 25 is removed, and the recess 23A may be formed on the side surface of the insulating layer 23, as shown in FIG. 6. In this case, the conductive layer 42 is formed on the inner wall of the recess 23A of the insulating layer 23, and a cavity is formed inside the recess 23A.

The structure in the modification example shown in FIG. 6 is similar to the structure shown in FIG. 5, except that the recess 23A is formed in the insulating layer 23 between the conductive layers 25 and the conductive layer 42 and the cavity are present in the recess 23A.

Figure 7:
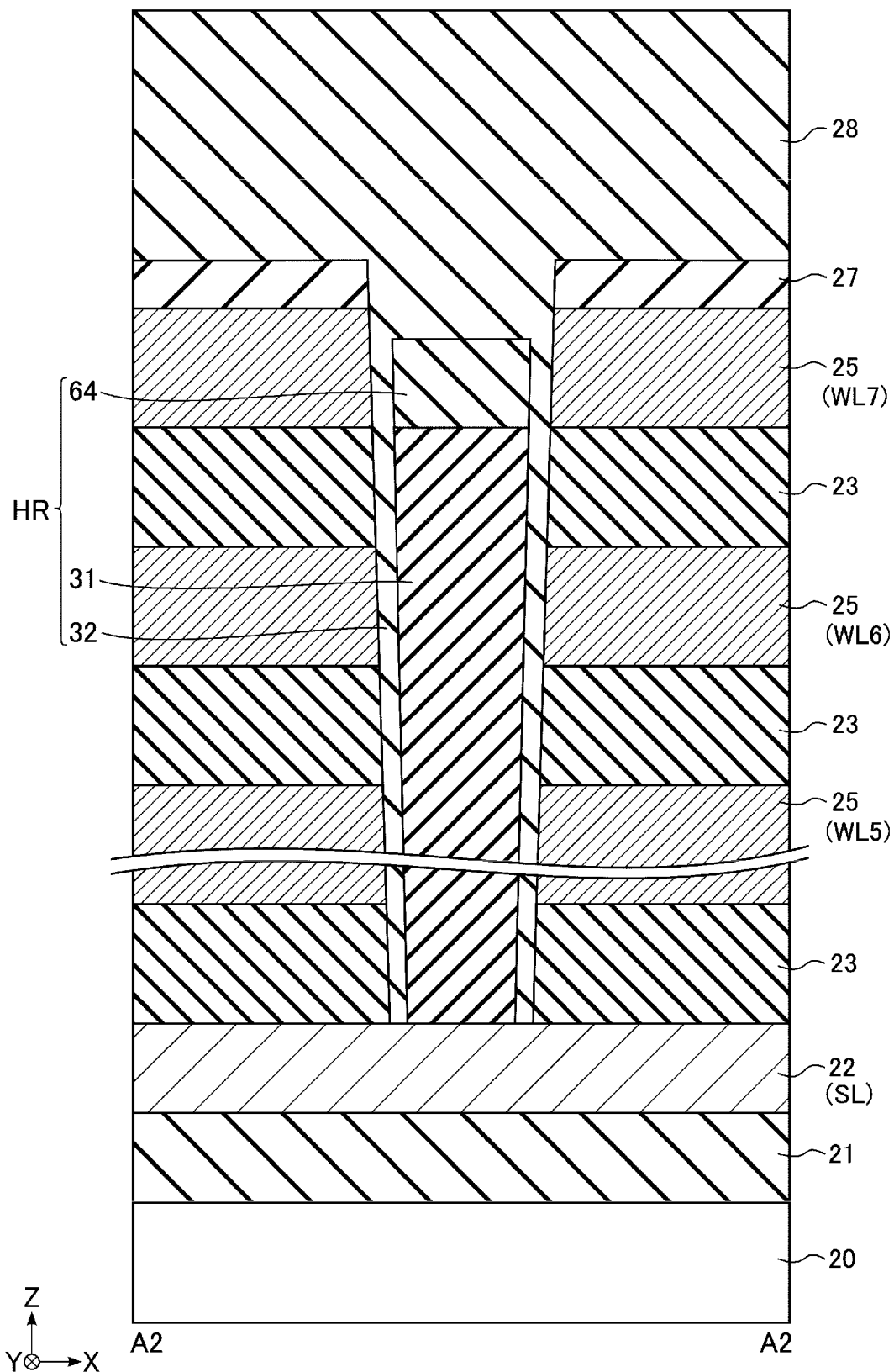
FIG. 7 is a cross-sectional view of a support column in the semiconductor storage device of the first embodiment.

The structure of the support columns HR in the hook-up area HA will be described with reference to FIGS. 3 and 7. FIG. 7 is a cross-sectional view taken along the line A2-A2 in FIG. 3, and shows a cross section of the support column HR.

As shown in FIG. 3, the support column (or insulation plug) HR is provided around the insulation plug 30 or the contact plug CC. An example in which four support columns HR are arranged around the insulation plug 30 is shown.

As shown in FIG. 7, the support column HR has a columnar body and is stretched in the Z direction inside the conductive layers 24 and 25 and the insulating layer 23 above the semiconductor substrate 20. The support column HR reaches from the conductive layer 25 as the uppermost layer in the terrace area to the insulating layer 23 as the lowermost layer or the conductive layer 22. The distance from the surface of the semiconductor substrate 20 to the upper surface of the support column HR is substantially the same as the distance from the surface of the semiconductor substrate 20 to the upper surface of the insulation plug 30.

The support column HR has an insulating layer 31 and an insulating layer 32 provided on the outer periphery of the insulating layer 31, similarly to the insulation plug 30. The support column HR further includes a silicon layer 64 provided on the insulating layer 31. The insulating layers 31 and 32 of the support column HR are formed of the same material by manufacturing process which is the same as that of the insulating layers 31 and 32 in the insulation plug 30.

1.2.2.2 Cross-Sectional Structure of Memory Array Area

As shown in FIG. 4, in the memory array area MA, the insulating layer 21 is provided on the semiconductor substrate 20, and the conductive layer 22 is provided on the insulating layer 21, similarly to the hook-up area HA. A stacked body in which an insulating layer 23, a conductive layer 24, a plurality of conductive layers 25, and a conductive layer 26 are alternately stacked is provided on the conductive layer 22.

A plurality of memory pillars MP are provided in the stacked body including the insulating layer 23 and the conductive layers 24, 25 and 26. Each memory pillar MP has a columnar body shape and is stretched in the Z direction. Each memory pillar MP reaches to the conductive layer 22 from the upper surface of the insulating layer 28 via the insulating layer 27, the conductive layers 26 and 25, the insulating layer 23, and the conductive layer 24. A contact plug CP1 is provided on the upper surface of the memory pillar MP, and a conductive layer 29 is provided on the contact plug CP1. The conductive layer 29 functions as the bit line BL.

Figure 8:
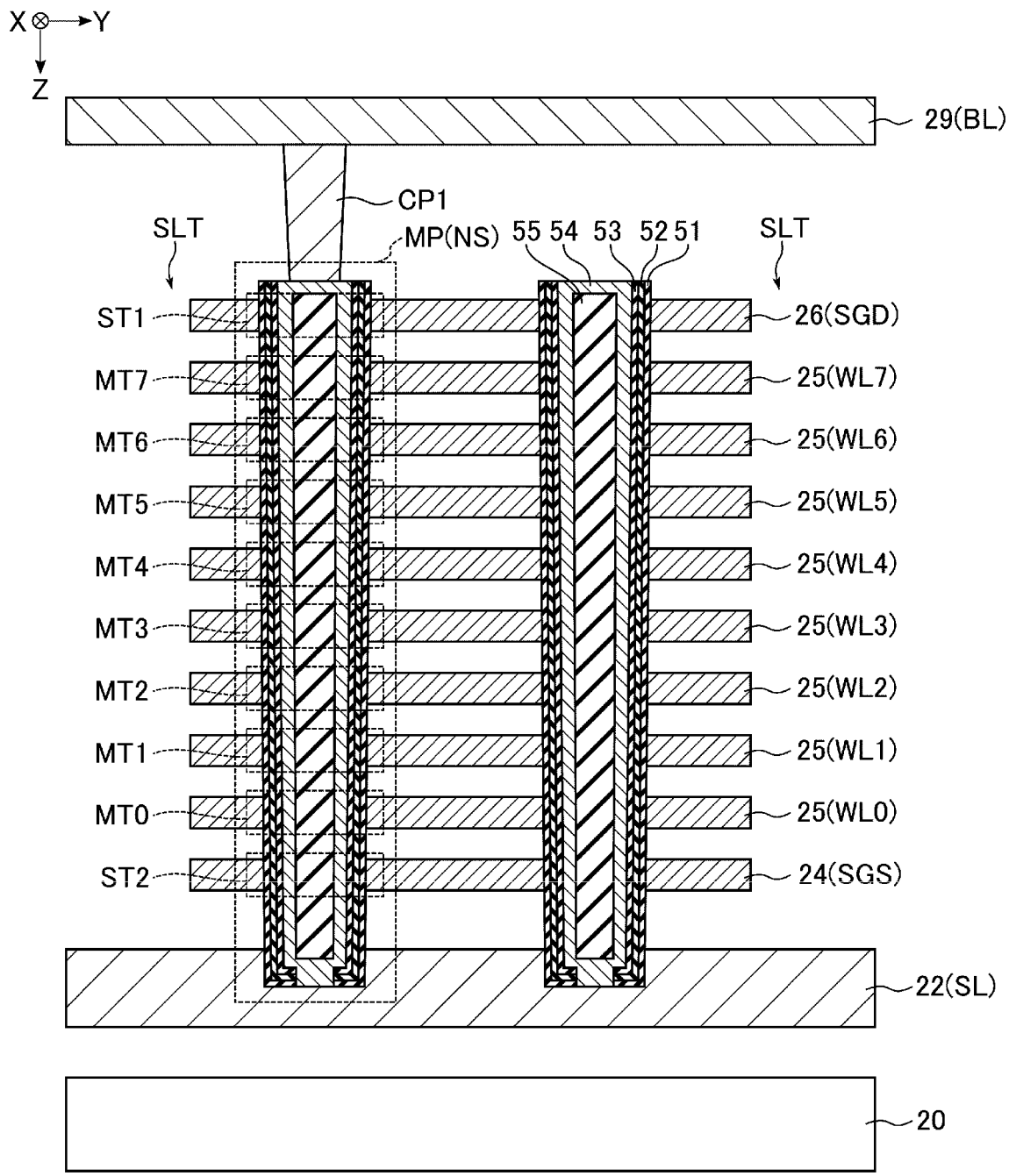
FIG. 8 is a cross-sectional view of a memory pillar in a memory array area in the semiconductor storage device of the first embodiment.

The memory pillar MP (or the NAND string NS) will be described in detail below with reference to FIG. 8. FIG. 8 is a cross-sectional view of the memory pillar MP provided in the memory array area MA. The memory pillar MP includes memory cell transistors MT0 to MT7 and select transistors ST1 and ST2. It is noted that the insulating layers 21, 23, 27, and 28 between the conductive layers are omitted in FIG. 8.

On the conductive layer 22, a plurality of slits SLT along (or parallel to) the XZ plane are arranged in the Y direction. The stacked body (or the structure) on the conductive layer 22 and between the adjacent slits SLT corresponds to, for example, one string unit SU.

The conductive layer 24, the plurality of conductive layers 25, and the conductive layer 26 are provided on the conductive layer 22 and between the adjacent slits SLT in ascending order from the lower layer. Among these conductive layers, the conductive layers adjacent to each other in the Z direction are stacked with the interlayer insulation film interposed therebetween.

The plurality of memory pillars MP are, for example, arranged in a staggered manner in the X direction and the Y direction. Each of the plurality of memory pillars MP extends (or penetrates) in the stacked body between the slits SLT in the Z direction. Each memory pillar MP is provided via the conductive layers 26, 25, 24 so as to reach to the conductive layer 22 from the upper surface of the conductive layer 26. Each memory pillar MP functions as one NAND string NS.

The memory pillar MP may include, for example, a block insulating layer 51, a charge storage layer 52, a tunnel insulating layer (also referred to as a tunnel insulation film) 53, a semiconductor layer 54, and a core insulating layer 55. Specifically, the block insulating layer 51 is provided on the inner wall of the memory hole for forming the memory pillar MP. The charge storage layer 52 is provided on the inner wall of the block insulating layer 51. The tunnel insulating layer 53 is provided on the inner wall of the charge storage layer 52. The semiconductor layer 54 is provided inside the tunnel insulating layer 53. Further, the core insulating layer 55 is provided inside the semiconductor layer 54.

In such a structure of the memory pillar MP, a portion, in which the memory pillar MP and the conductive layer 24 intersect with each other, functions as the select transistor ST2. Portions, in which the memory pillar MP and the conductive layer 25 intersect with each other, function as the memory cell transistors MT0 to MT7, respectively. Further, a portion, in which the memory pillar MP and the conductive layer 26 intersect with each other, functions as the select transistor ST1.

The semiconductor layer 54 functions as a channel layer of the memory cell transistor MT and the select transistors ST1 and ST2. A current path of the NAND string NS is formed inside the semiconductor layer 54.

The charge storage layer 52 has a function of storing charges injected from the semiconductor layer 54 in the memory cell transistor MT. The charge storage layer 52 includes, for example, a silicon nitride film.

The tunnel insulating layer 53 functions as a potential barrier when charges are injected from the semiconductor layer 54 into the charge storage layer 52 or when the charges stored in the charge storage layer 52 diffuse into the semiconductor layer 54. The tunnel insulating layer 53 includes, for example, a silicon oxide film.

The block insulating layer 51 prevents the charge stored in the charge storage layer 52 from diffusing into the conductive layer 25 (word line WL). The block insulating layer 51 includes, for example, a silicon oxide layer and a silicon nitride layer.

A conductive layer 29 is provided on the upper surface of the memory pillar MP via the contact plug CP1. The conductive layer 29 is a line-shaped wiring layer stretched in the Y direction and functions as the bit line BL. The plurality of conductive layers 29 are arranged in the X direction, and each conductive layer 29 is electrically connected to one memory pillar MP corresponding to each string unit SU. Specifically, in each string unit SU, the contact plug CP1 is provided on the semiconductor layer 54 in each memory pillar MP. Further, the conductive layer 29 is provided on the contact plug CP1. The conductive layer 29 includes, for example, copper (Cu), aluminum (Al), or tungsten (W). The contact plug CP1 includes, for example, a conductive layer such as tungsten (W).

The memory cell array 11 may have other configurations. The configuration of the memory cell array 11 is described in, for example, U.S. patent application Ser. No. 12/407,403 entitled "THREE DIMENSIONAL STACKED NON-VOLATILE SEMICONDUCTOR MEMORY" and filed on Mar. 19, 2009. In addition, the configuration is described in U.S. patent application Ser. No. 12/406,524 entitled "THREE DIMENSIONAL STACKED NONVOLATILE SEMICONDUCTOR MEMORY" and filed on Mar. 18, 2009, U.S. patent application Ser. No. 12/679,991 entitled "NON-VOLATILE SEMICONDUCTOR STORAGE DEVICE AND METHOD OF MANUFACTURING THE SAME" and filed on Mar. 25, 2010, and U.S. patent application Ser. No. 12/532,030 entitled "SEMICONDUCTOR MEMORY AND METHOD FOR MANUFACTURING SAME" and filed on Mar. 23, 2009. The entire patent applications are incorporated herein by reference.

1.3 Method of Manufacturing Semiconductor Storage Device

Next, a method of manufacturing the contact plug CC in the semiconductor storage device 1 of the first embodiment will be described. FIGS. 9 to 32 are cross-sectional views of processes showing the method of manufacturing the contact plug CC in the semiconductor storage device. FIGS. 9 to 32 shows the contact plug CC connected to the select gate line SGD and the word lines WL7 and WL6, where the other contact plugs CC, word lines WL0 to WL4, the semiconductor substrate 20, the insulating layer 21, the conductive layer 22, and the like are omitted.

Figure 9:
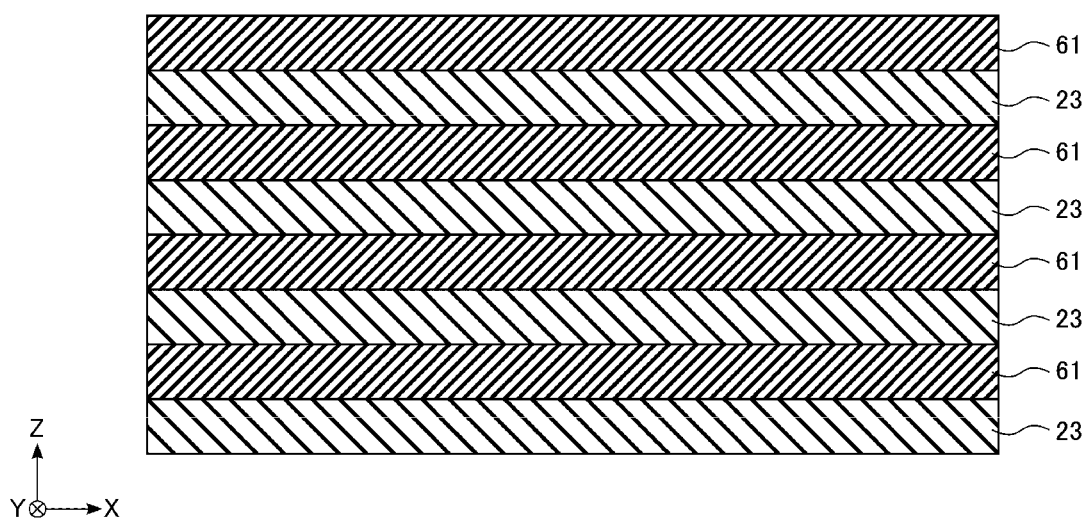
FIG. 9 is a cross-sectional view showing the method of manufacturing the semiconductor storage device of the first embodiment.

First, as shown in FIG. 9, a stacked body, in which the insulating layer 23 and an insulating layer 61 are alternately stacked, are formed on the conductive layer 22 on the semiconductor substrate 20 by, for example, a chemical vapor deposition (CVD) method (or an atomic layer deposition (ALD) method). The insulating layer 61 is a sacrificial layer that will be removed in a later process and replaced with a conductive layer as the word line WL. That is, the insulating layer 61 is replaced with the conductive layer 25 or 26 in a later word line WL replacement process.

Figure 10:
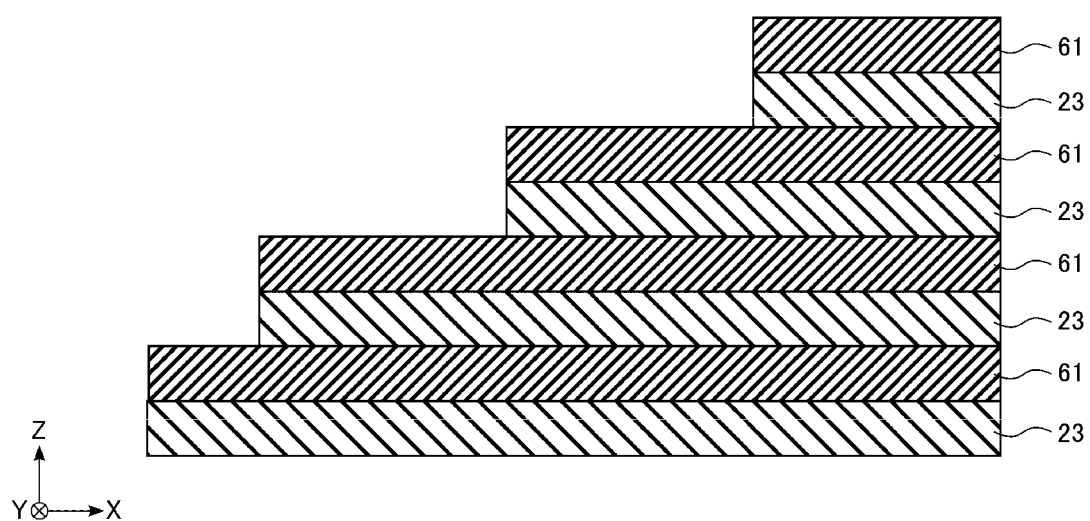
FIG. 10 is a cross-sectional view showing the method of manufacturing the semiconductor storage device of the first embodiment.

Next, the insulating layer 61 and the insulating layer 23 are removed by etching based on an RIE method and slimming of a mask pattern (not shown), and the insulating layer 61 and the insulating layer 23 are formed in a stepwise manner along the X direction as shown in FIG. 10. As a result, a terrace area, which is drawn out in a stepwise manner and does not overlap the upper insulating layer 61 and the insulating layer 23, is formed for each set of the insulating layer 61 and the insulating layer 23.

Figure 11:
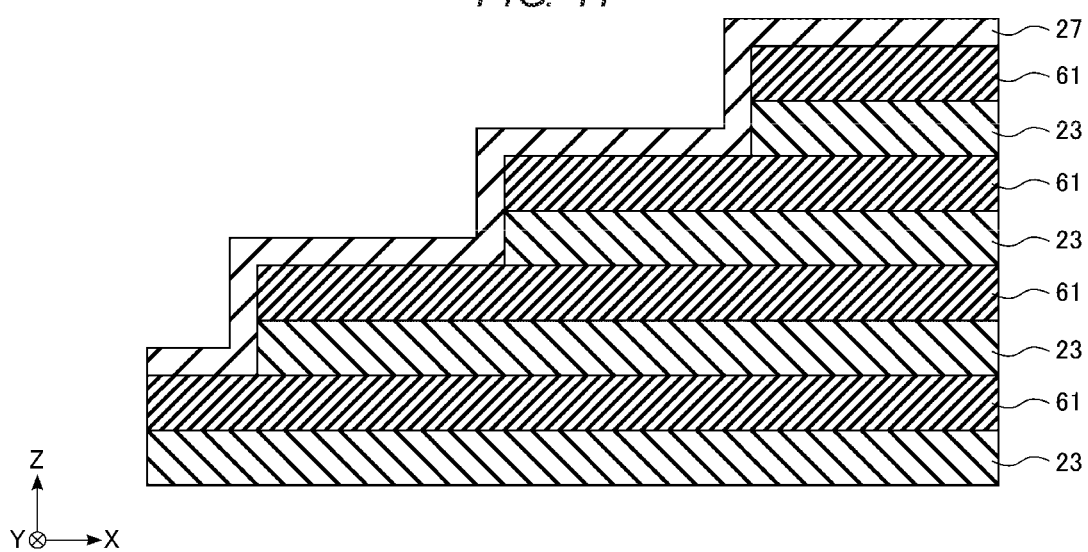
FIG. 11 is a cross-sectional view showing the method of manufacturing the semiconductor storage device of the first embodiment.

Next, as shown in FIG. 11, the insulating layer 27 is formed on the stepwise terrace area, that is, the insulating layer 61, by, for example, the CVD method (or the ALD method). The insulating layer 27 functions as a stopper layer that protects the insulating layer 23 from being removed in removal of the insulating layer 62 performed in a later process. The insulating layer 27 includes, for example, a silicon oxycarbide layer.

Figure 12:
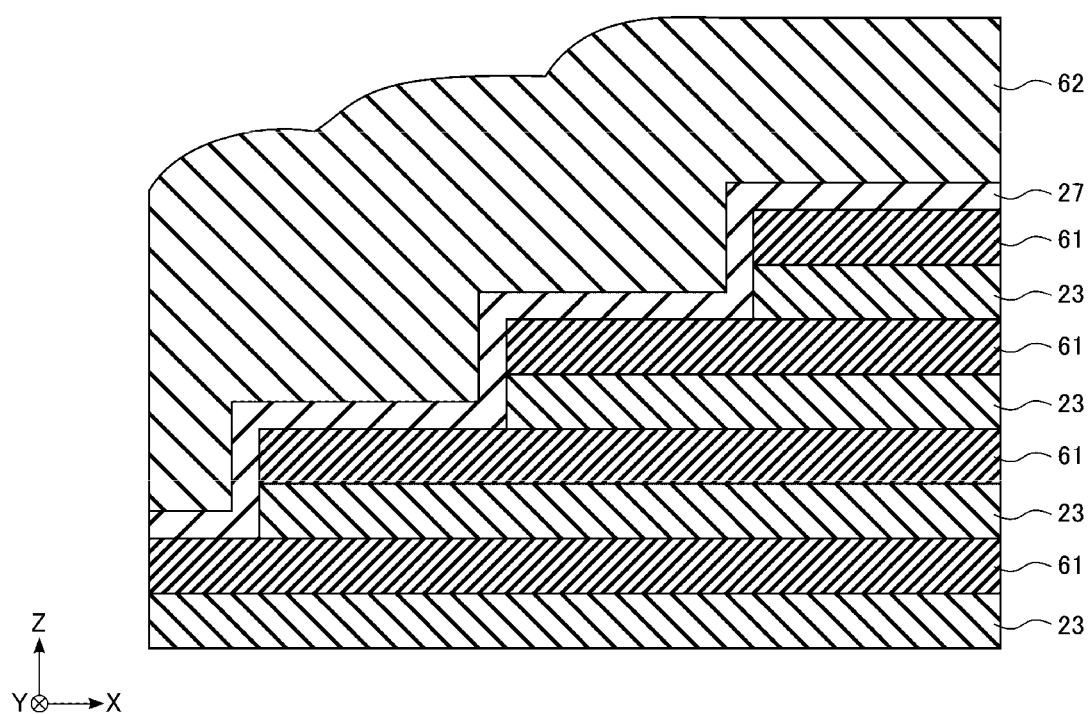
FIG. 12 is a cross-sectional view showing the method of manufacturing the semiconductor storage device of the first embodiment.
Figure 13:
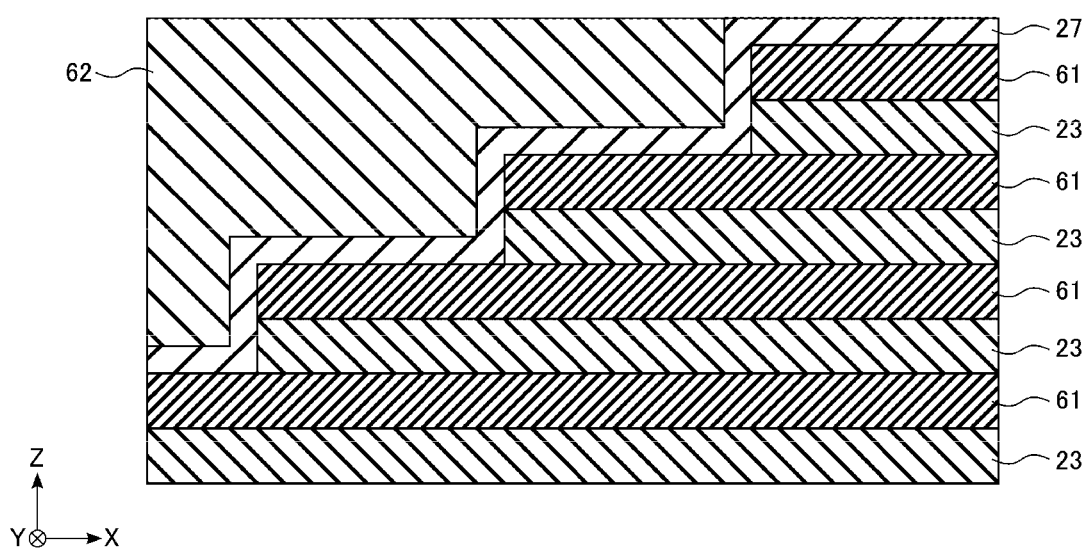
FIG. 13 is a cross-sectional view showing the method of manufacturing the semiconductor storage device of the first embodiment.

Next, as shown in FIG. 12, the insulating layer 62 is formed on the insulating layer 27 by, for example, the CVD method (or the ALD method). Further, as shown in FIG. 13, the insulating layer 62 is planarized by, for example, chemical mechanical polishing (CMP).

Figure 14:
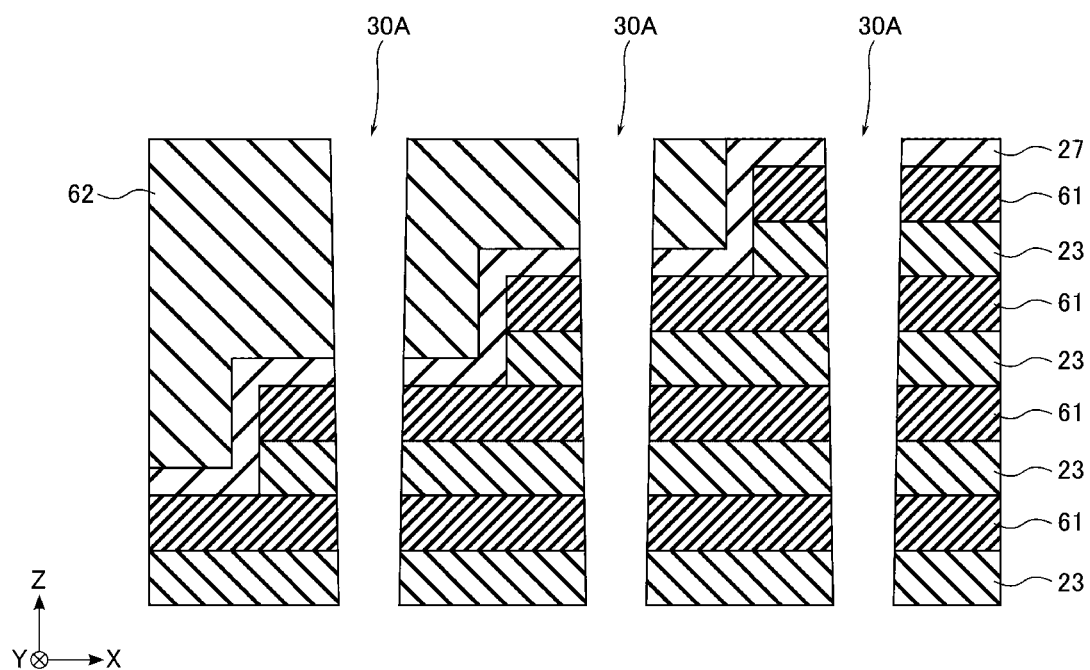
FIG. 14 is a cross-sectional view showing the method of manufacturing the semiconductor storage device of the first embodiment.

Next, as shown in FIG. 14, a hole 30A for the insulation plug 30 is formed in the Z direction in the insulating layers 27, 61, and 23 in the terrace area by, for example, a reactive ion etching (RIE) method. The holes 30A reaches from the upper surfaces of the insulating layers 62 and 27 to the insulating layer 23 as the lowermost layer or the conductive layer 22.

Figure 15:
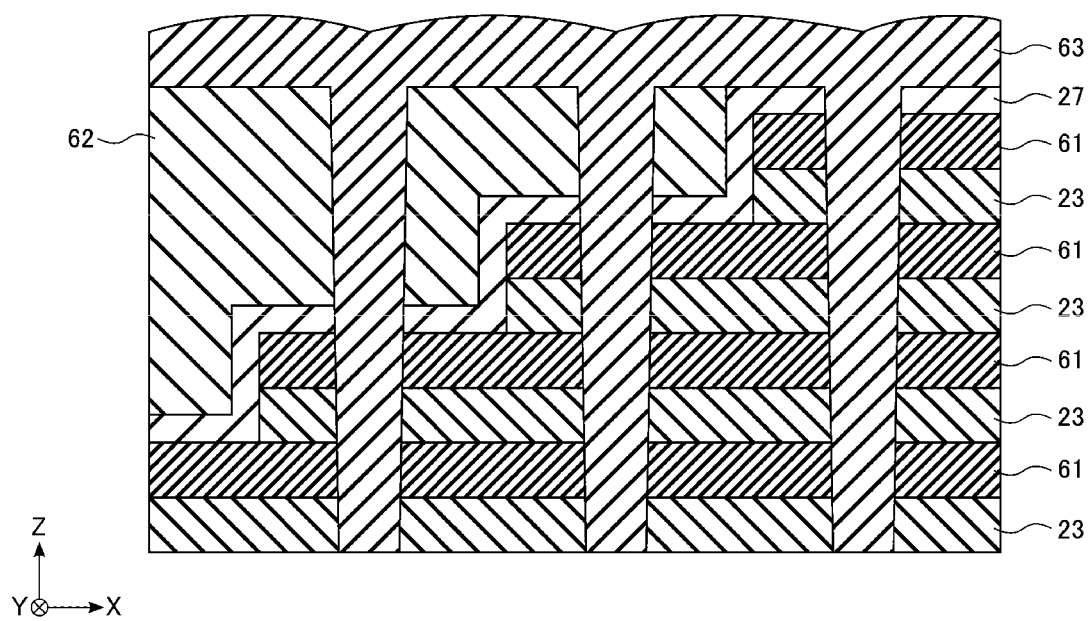
FIG. 15 is a cross-sectional view showing the method of manufacturing the semiconductor storage device of the first embodiment.
Figure 16:
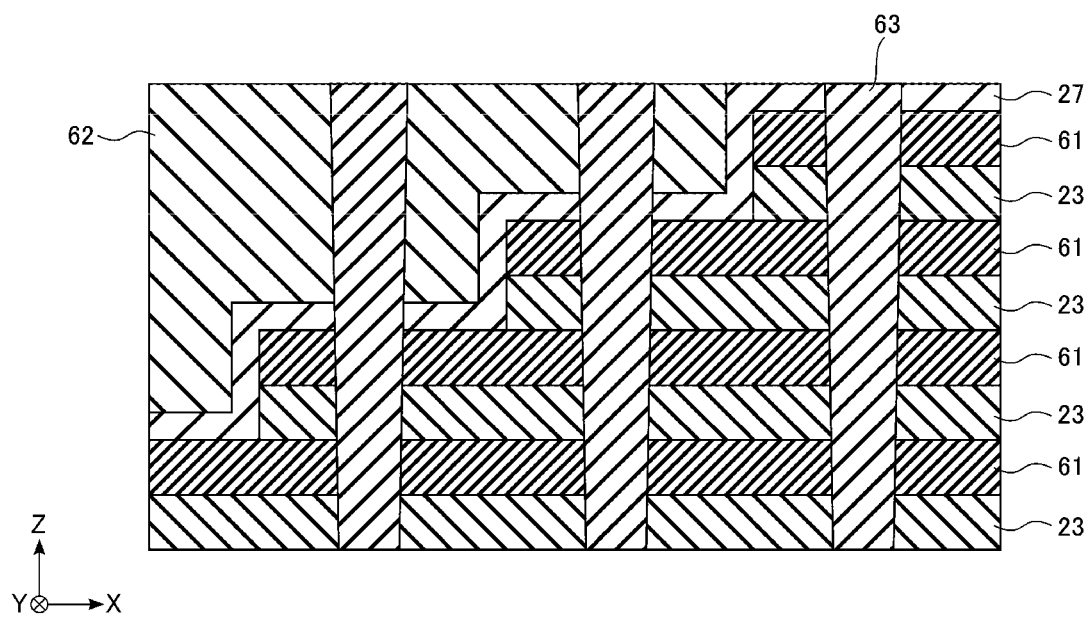
FIG. 16 is a cross-sectional view showing the method of manufacturing the semiconductor storage device of the first embodiment.
Figure 17:
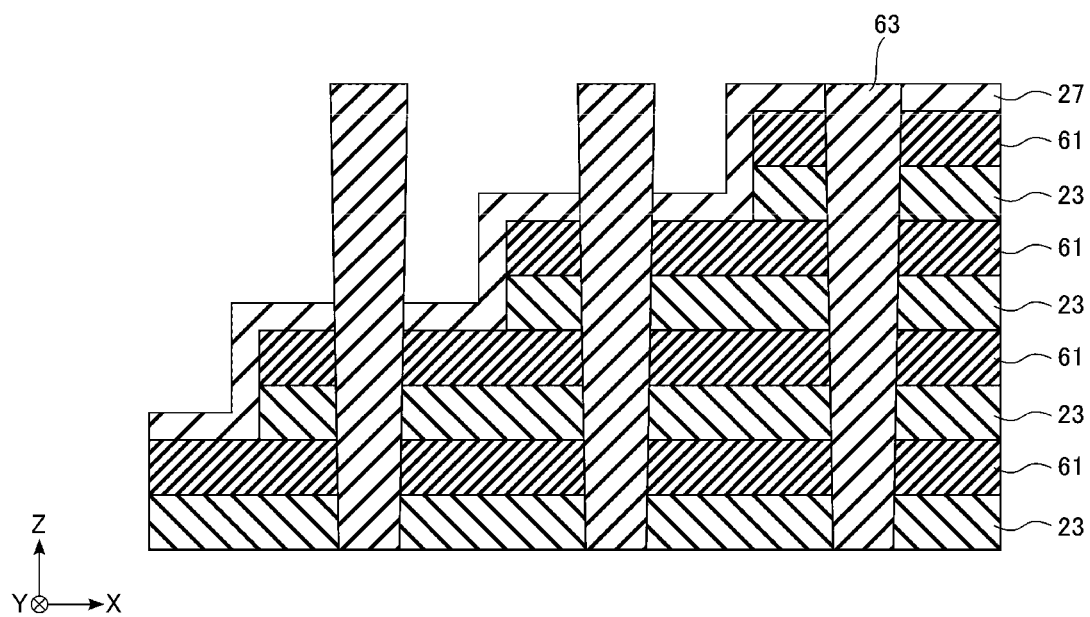
FIG. 17 is a cross-sectional view showing the method of manufacturing the semiconductor storage device of the first embodiment.

Next, as shown in FIG. 15, a silicon layer 63 is formed in the insulation plug hole 30A and on the insulating layers 27 and 62 by, for example, a CVD method (or an ALD method). Next, as shown in FIG. 16, the silicon layer 63 on the insulation plug hole 30A and the insulating layers 27 and 62 is planarized by, for example, a CMP method. Further, as shown in FIG. 17, the insulating layer 62 on the insulating layer 27 is removed.

Figure 18:
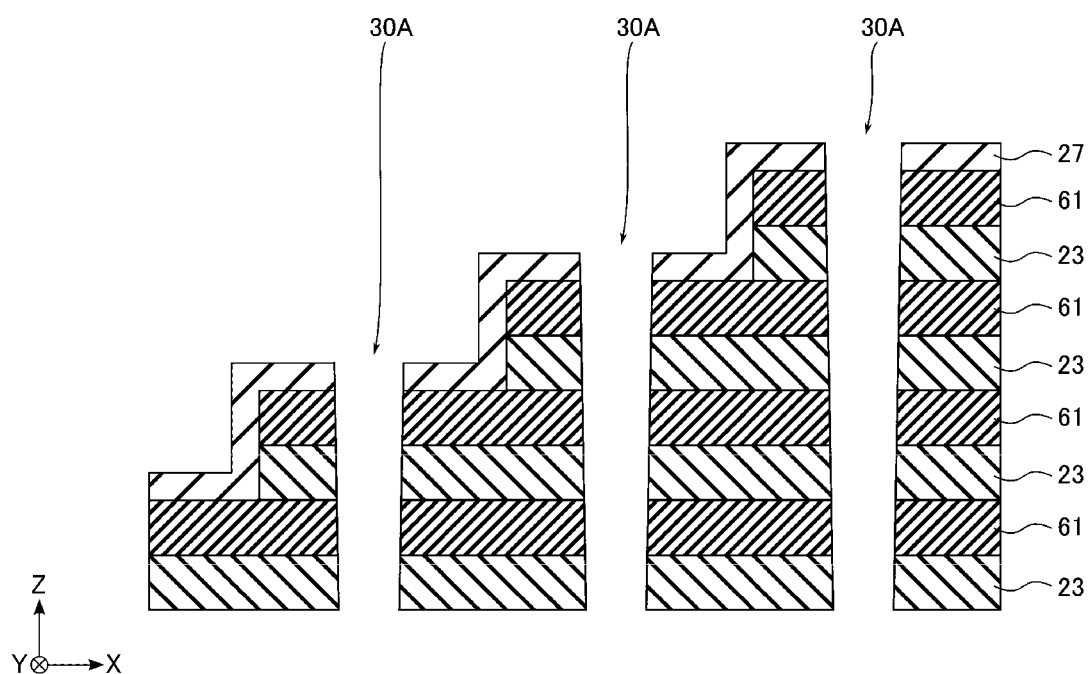
FIG. 18 is a cross-sectional view showing the method of manufacturing the semiconductor storage device of the first embodiment.
Figure 19:
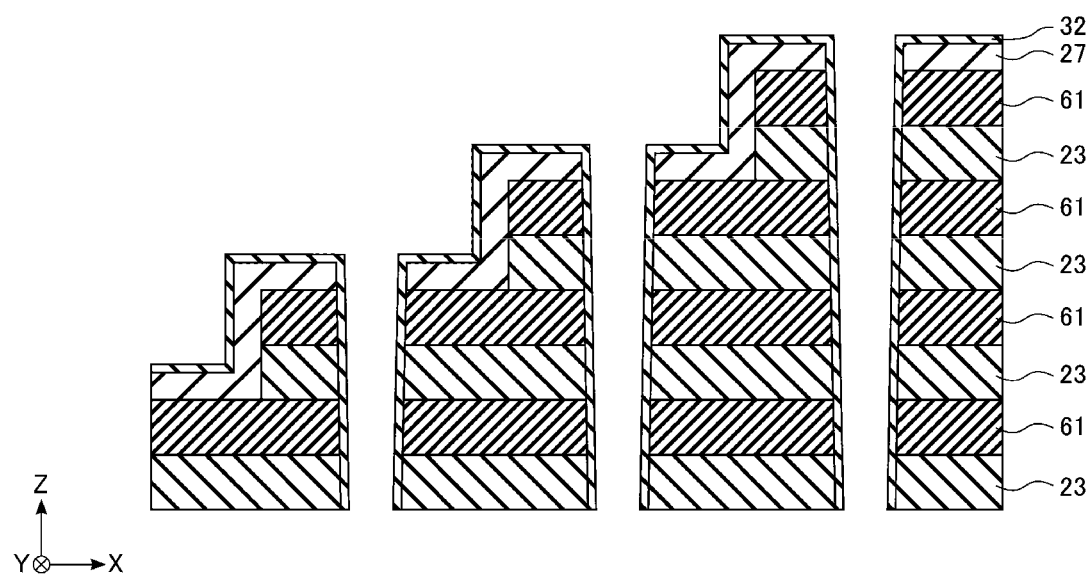
FIG. 19 is a cross-sectional view showing the method of manufacturing the semiconductor storage device of the first embodiment.

Next, as shown in FIG. 18, the silicon layer 63 embedded in the insulation plug hole 30A is removed, thereby emptying the insulation plug hole 30A. Further, as shown in FIG. 19, the insulating layer 32 is formed on the inner wall of the insulation plug hole 30A and on the insulating layer 27 by, for example, a CVD method (or an ALD method). The insulating layer 32 includes, for example, a silicon oxide layer or a silicon oxycarbide layer. The insulating layer 32 is formed on the inner wall of the insulation plug hole 30A in order to prevent the conductive layer as a word line from being short-circuited in the later word line replacement process.

Figure 20:
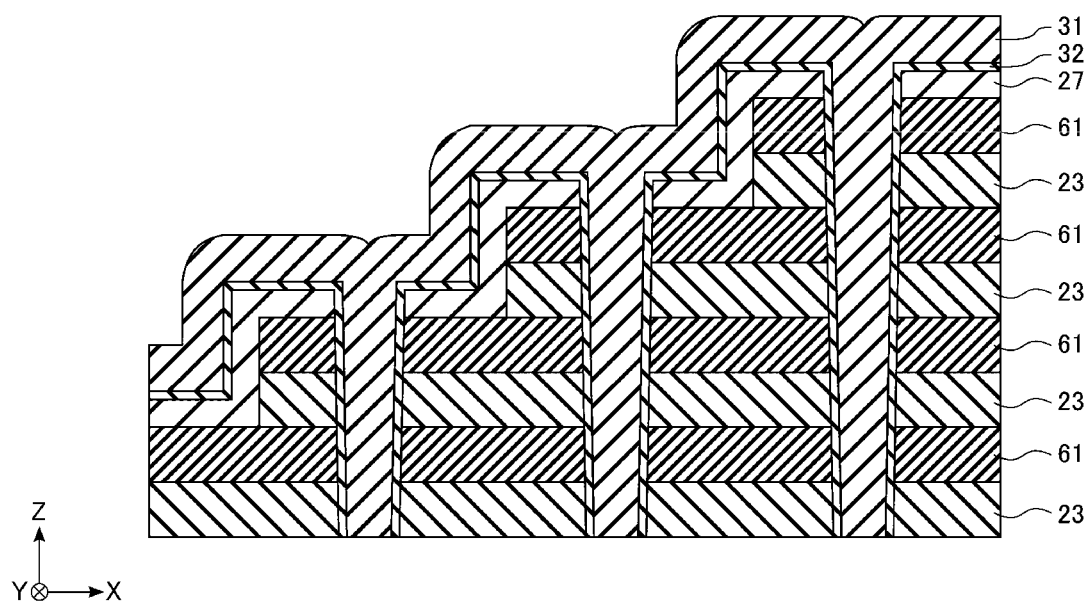
FIG. 20 is a cross-sectional view showing the method of manufacturing the semiconductor storage device of the first embodiment.

Next, as shown in FIG. 20, the insulating layer 31 is formed in the insulation plug hole 30A and on the insulating layer 32 by, for example, a CVD method (or an ALD method). The insulating layer 31 includes, for example, a silicon nitride layer, a silicon carbonitride layer, or a silicon carbide layer.

Figure 21:
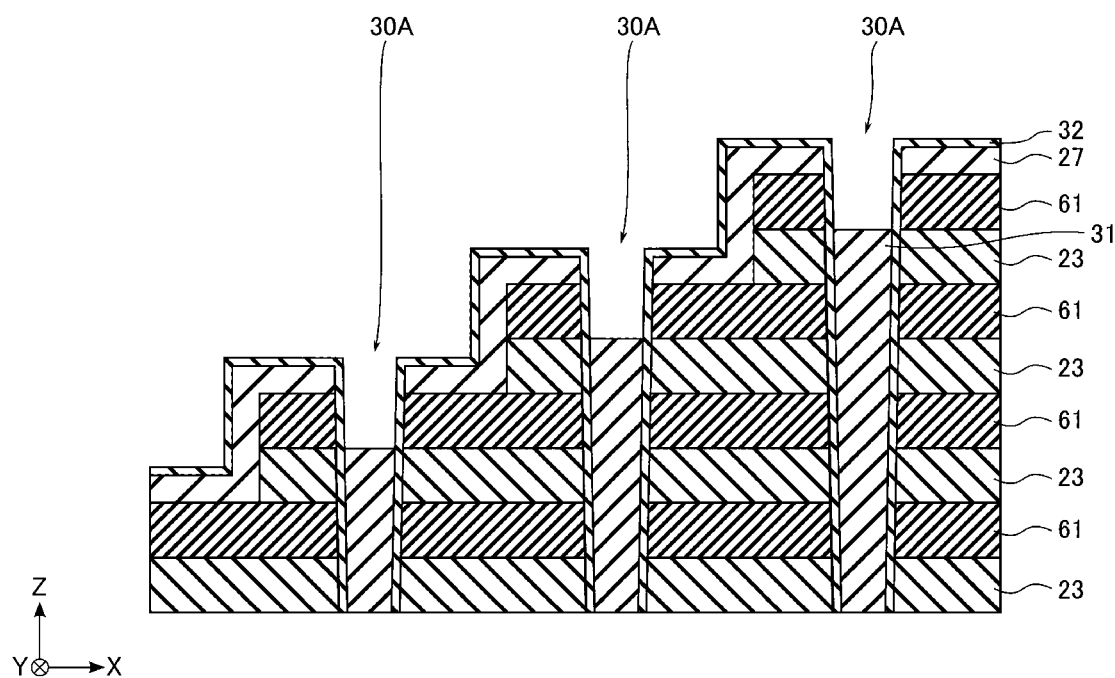
FIG. 21 is a cross-sectional view showing the method of manufacturing the semiconductor storage device of the first embodiment.

Next, as shown in FIG. 21, the insulating layer 31 formed on the insulation plug hole 30A and the insulating layer 32 is etched back, and the insulating layer 31 is removed up to a height (or position) of the boundary between the insulating layer 61 as the uppermost layer and the insulating layer 23 as the uppermost layer in each insulation plug hole 30A.

Figure 22:
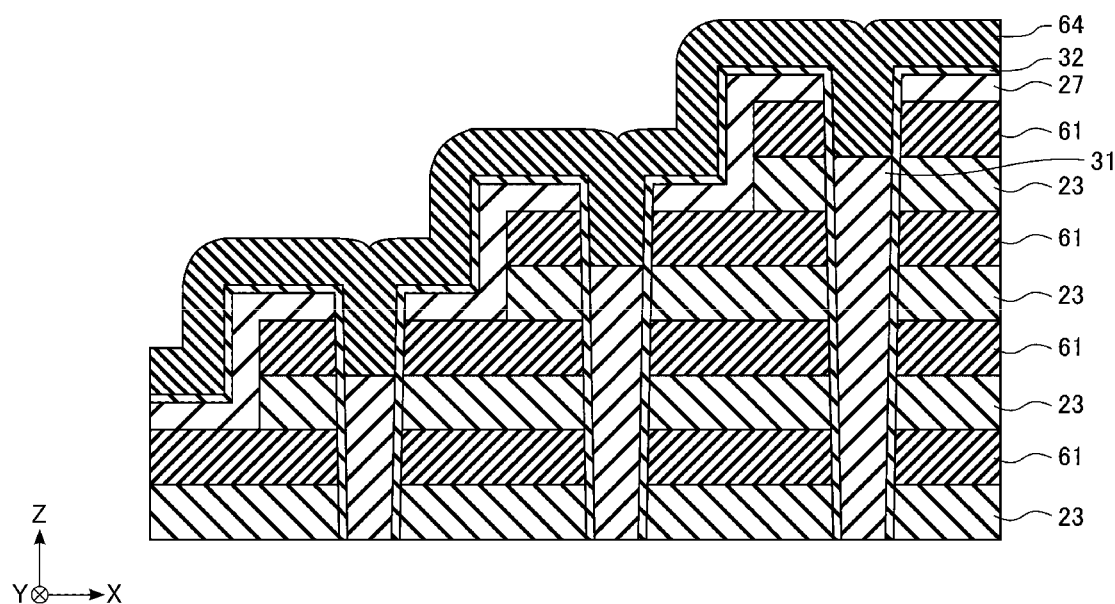
FIG. 22 is a cross-sectional view showing the method of manufacturing the semiconductor storage device of the first embodiment.
Figure 23:
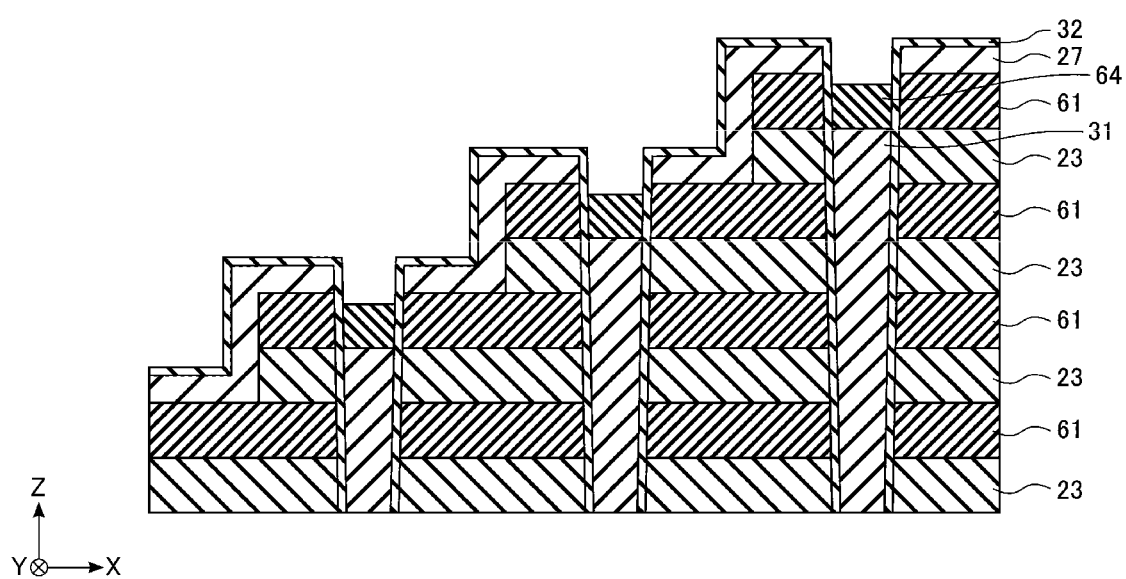
FIG. 23 is a cross-sectional view showing the method of manufacturing the semiconductor storage device of the first embodiment.

Next, as shown in FIG. 22, a silicon layer 64 is formed on the insulating layer 31 and the insulating layer 32 in the insulation plug hole 30A by, for example, a CVD method (or an ALD method). Further, as shown in FIG. 23, the silicon layer 64 formed on the insulating layer 31 and the insulating layer 32 in the insulation plug hole 30A is etched back, and the silicon layer 64 is removed up to a height (or position) of the upper surface of the insulating layer 61 as the uppermost layer in each insulation plug hole 30A or a height lower than the upper surface.

Figure 24:
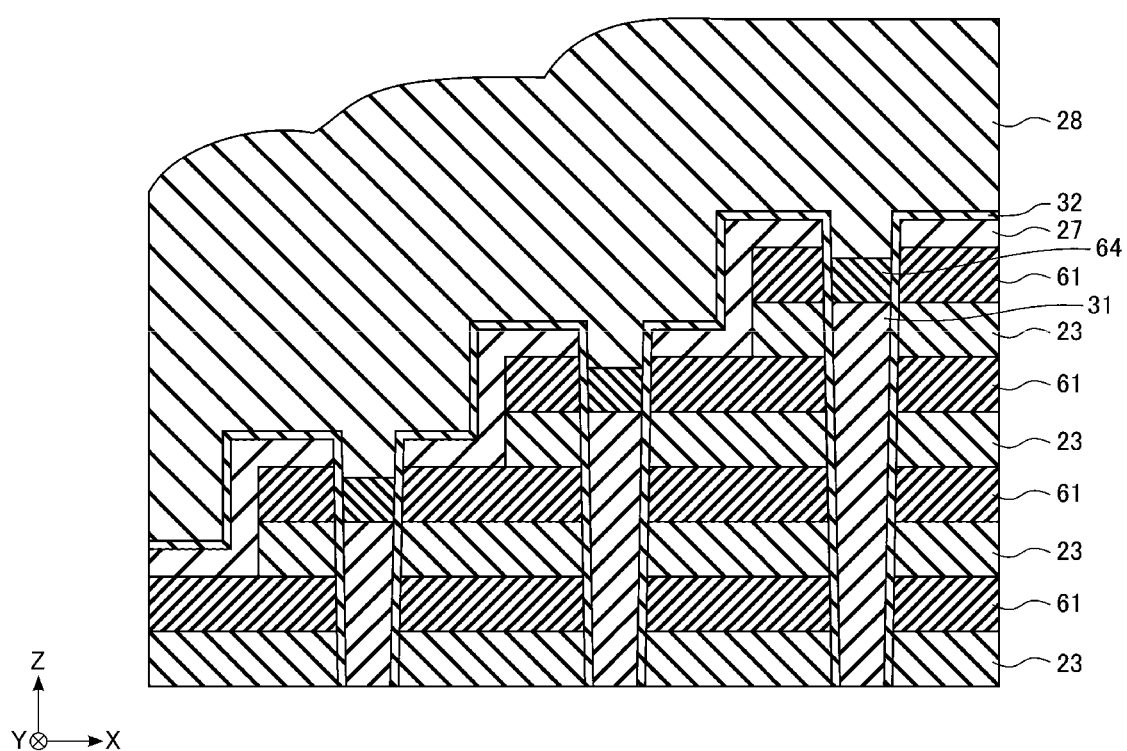
FIG. 24 is a cross-sectional view showing the method of manufacturing the semiconductor storage device of the first embodiment.
Figure 25:
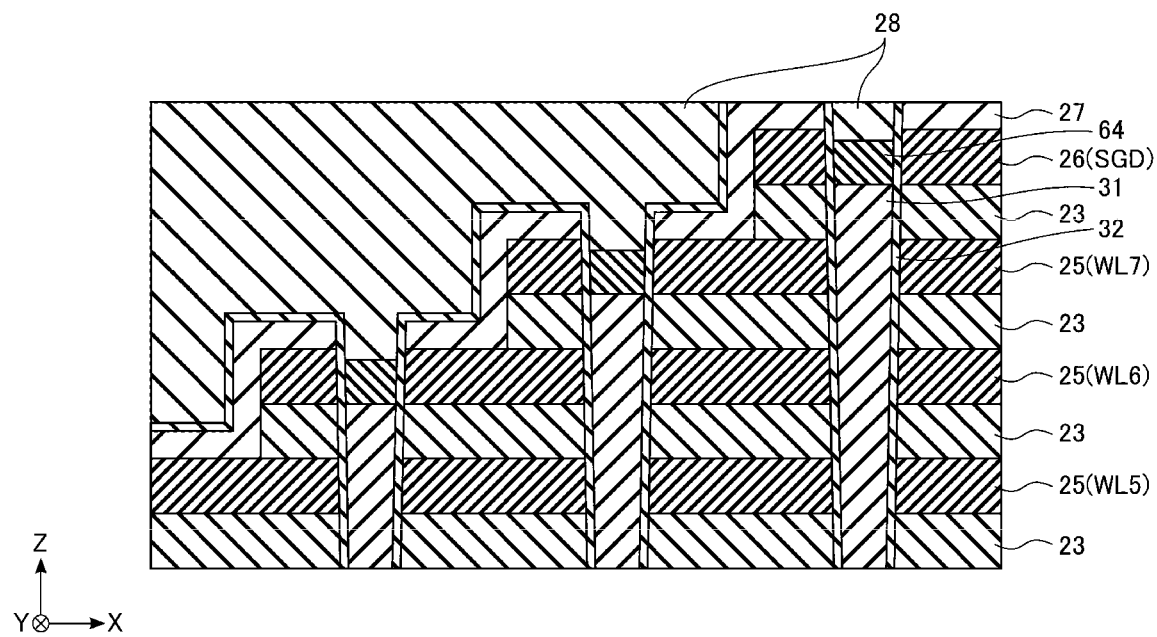
FIG. 25 is a cross-sectional view showing the method of manufacturing the semiconductor storage device of the first embodiment.

Next, as shown in FIG. 24, the insulating layer 28 is formed on the silicon layer 64 and the insulating layer 32 in the insulation plug hole 30A by, for example, a CVD method (or an ALD method). The insulating layer 28 includes, for example, a silicon oxide layer. Further, as shown in FIG. 25, the insulating layer 28 on the insulation plug hole 30A and the insulating layer 27 is planarized by, for example, the CMP method.

Figure 26:
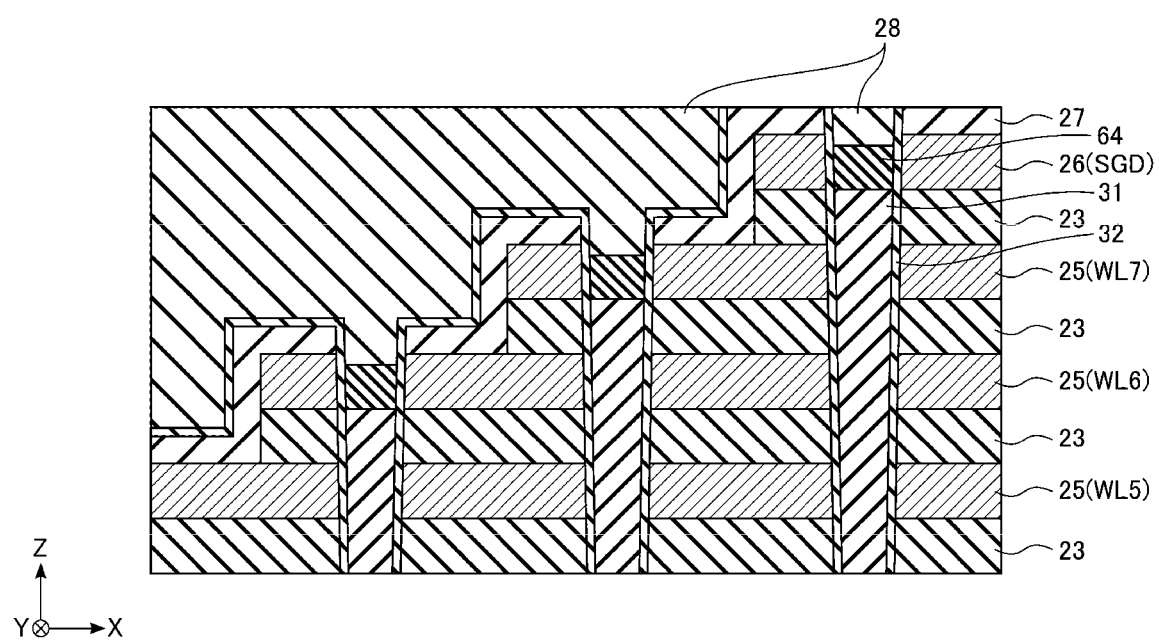
FIG. 26 is a cross-sectional view showing the method of manufacturing the semiconductor storage device of the first embodiment.

Next, as shown in FIG. 26, a word line replacement process of replacing the insulating layer 61 with the conductive layers 26, 25 and 24 is performed. That is, the insulating layer 61 is removed by wet etching to form a cavity between the insulating layers 23 adjacent in the Z direction. Then, the conductive layers 26, 25, and 24 are formed in the cavities formed by removing the insulating layer 61 via, for example, a CVD method (or an ALD method). Thereby, the conductive layer 26 as the select gate line SGD, the conductive layer 25 as the word lines WL0 to WL7, and the conductive layer 24 as the select gate line SGS are formed.

Figure 27:
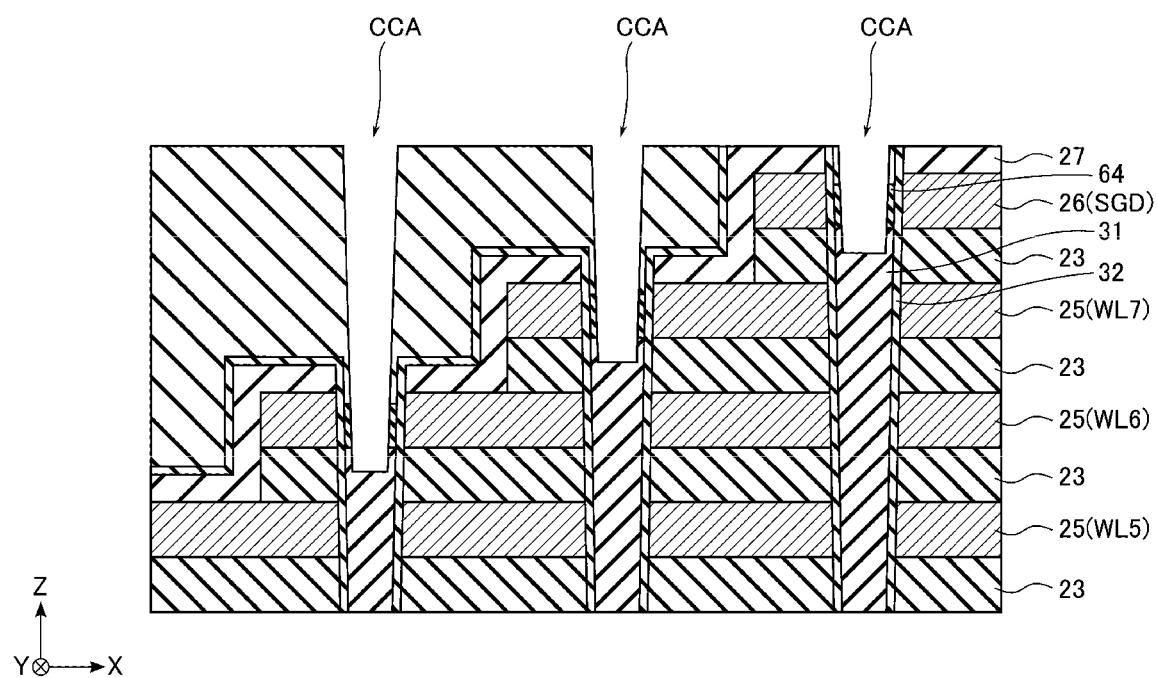
FIG. 27 is a cross-sectional view showing the method of manufacturing the semiconductor storage device of the first embodiment.

Next, as shown in FIG. 27, the insulating layer 28, the silicon layer 64, and the insulating layer 31 in the insulation plug hole 30A are removed by, for example, the RIE method, thereby forming a hole CCA for the contact plug CC.

Figure 28:
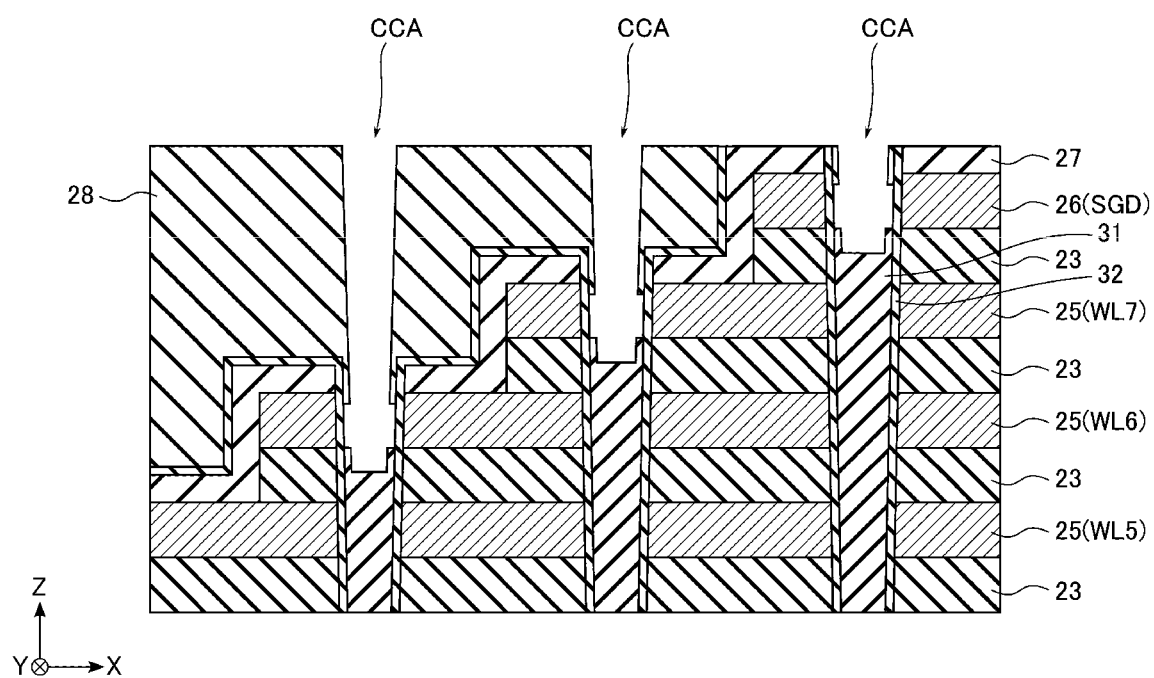
FIG. 28 is a cross-sectional view showing the method of manufacturing the semiconductor storage device of the first embodiment.
Figure 29:
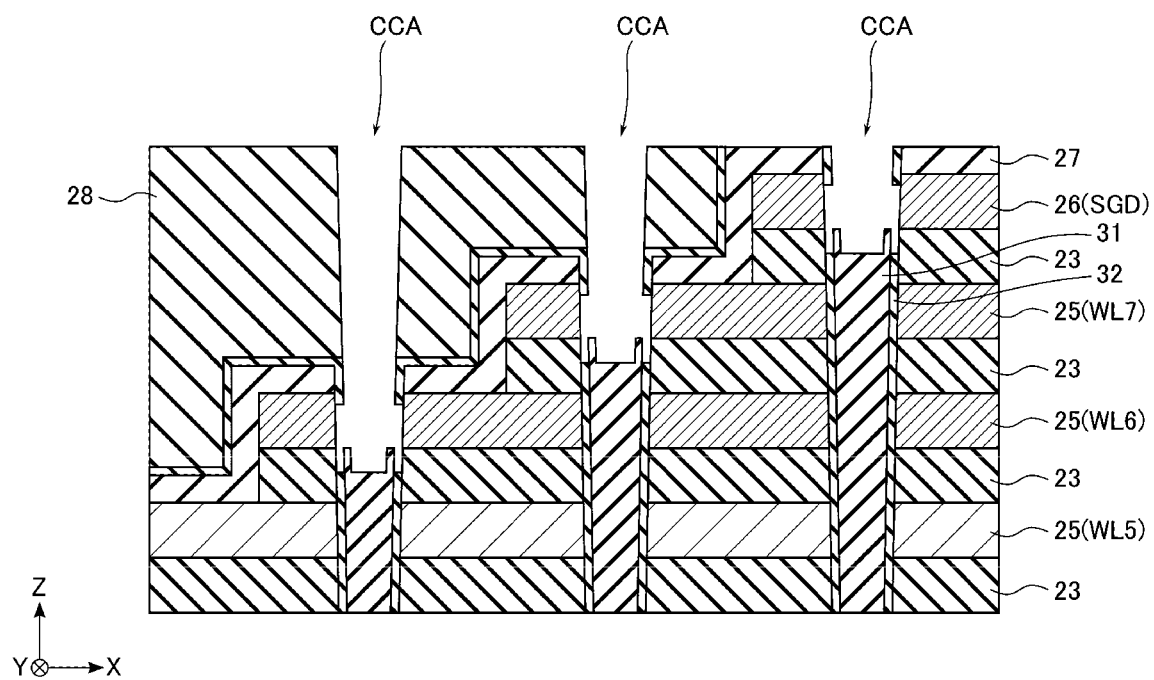
FIG. 29 is a cross-sectional view showing the method of manufacturing the semiconductor storage device of the first embodiment.

Next, as shown in FIG. 28, the silicon layer 64 at the bottom inside the contact plug hole CCA is removed. Further, as shown in FIG. 29, the insulating layer 32 on the side surface of the conductive layer 26 or 25 in the contact plug hole CCA is removed, thereby exposing the side surface of the conductive layer 26 or 25.

Figure 30:
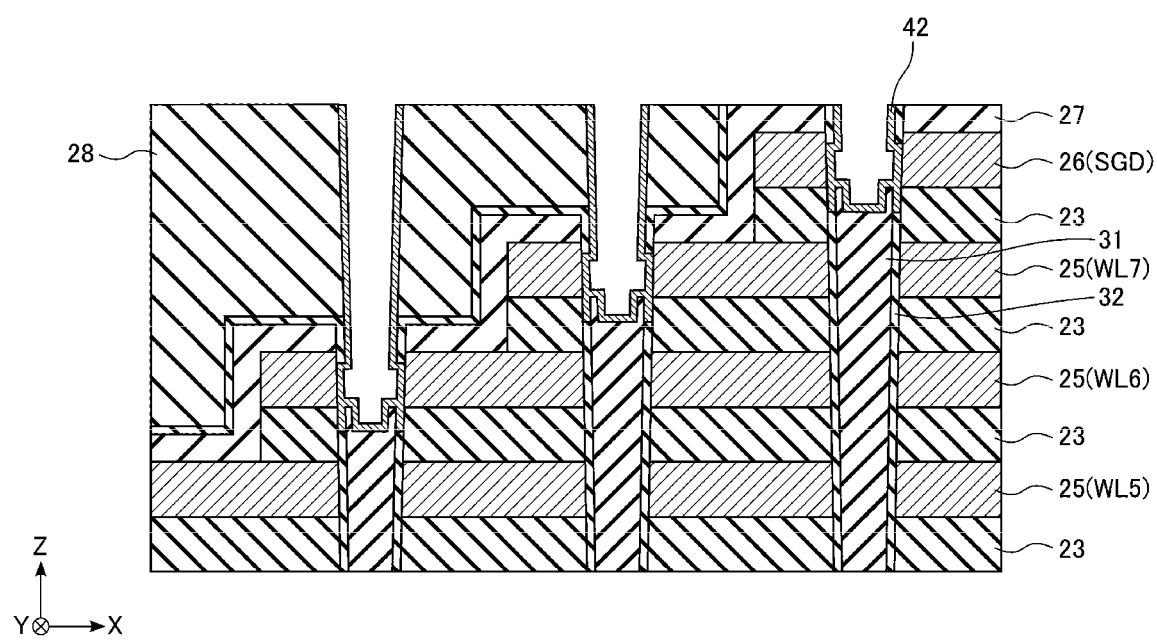
FIG. 30 is a cross-sectional view showing the method of manufacturing the semiconductor storage device of the first embodiment.

Next, as shown in FIG. 30, a conductive layer 42 is formed on the inner wall of the contact plug hole CCA. That is, the conductive layer 42 is formed on the exposed side surface of the conductive layer 26 or 25 in the contact plug hole CCA and the side surface of the insulating layer 28. The conductive layer 42 includes, for example, titanium nitride and functions as a barrier metal.

Figure 31:
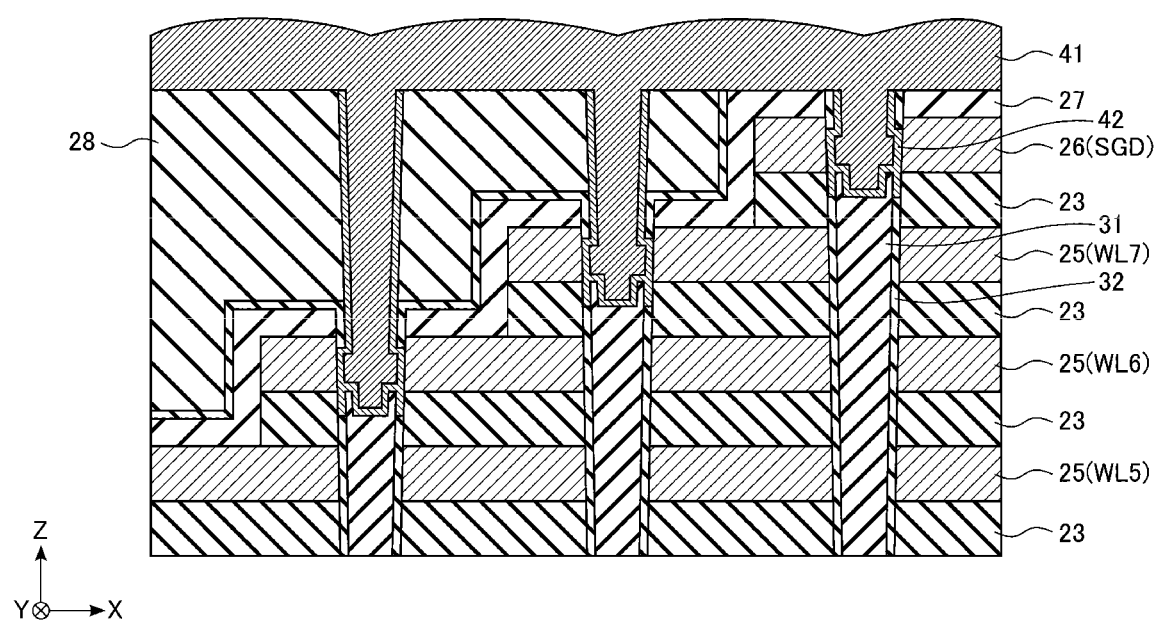
FIG. 31 is a cross-sectional view showing the method of manufacturing the semiconductor storage device of the first embodiment.
Figure 32:
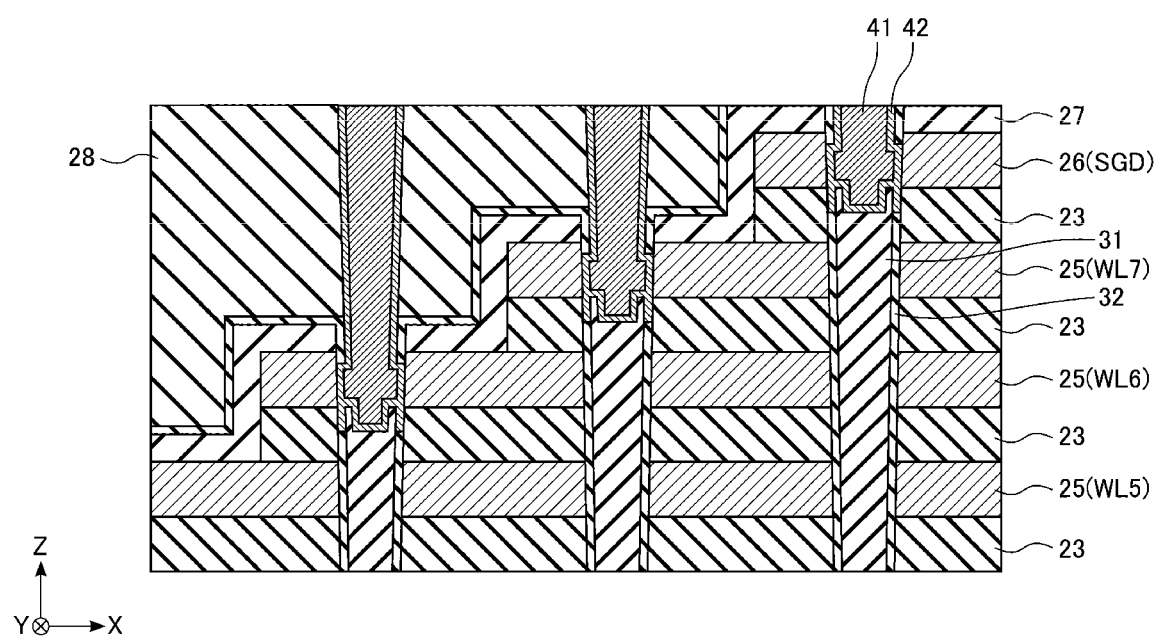
FIG. 32 is a cross-sectional view showing the method of manufacturing the semiconductor storage device of the first embodiment.

Next, as shown in FIG. 31, the conductive layer 41 is formed on the conductive layer 42 and the insulating layers 27 and 28 in the contact plug hole CCA by, for example, a CVD method (or an ALD method). The conductive layer 41 includes a metal layer such as tungsten. Further, as shown in FIG. 32, the conductive layer 41 formed above the contact plug hole CCA and on the insulating layers 27 and 28 is planarized by, for example, a CMP method.

Via the above processes, the contact plug CC in the hook-up area HA of the semiconductor storage device 1 is manufactured.

1.4 Effects of First Embodiment

According to the first embodiment, the operational reliability of the semiconductor storage device can be improved.

The effects of the first embodiment will be described in detail below.

For example, it can be considered that, in a semiconductor storage device in which memory cells are three-dimensionally arranged, in order to further increase the stacking of the word lines WL to which the memory cells are connected, the word lines WL are thinned or a material suitable for thinning the word lines is used. In such a case, there is a concern that the contact plug CC hole to be stopped on the upper surface of the word line WL may penetrate the word line WL in the process of forming the hole for the contact plug CC for connection to the word line WL.

In the first embodiment, in the process of forming the hole CCA for the contact plug CC, the dummy insulation plug 30 is provided under the word line WL as a connection target. The insulation plug 30 functions as a stopper (etch stop) that stops the progress of the hole CCA when the contact plug hole CCA is formed. Thereby, it is possible to prevent overetching during hole CCA processing in which the bottom of the hole CCA reaches the word line WL under the word line WL as a connection target when the contact plug hole CCA is formed. As a result, it is possible to reduce a defect that the contact plug CC is connected to a word line other than the word line as a connection target, and it is possible to improve the reliability of operation in the semiconductor storage device.

In the first embodiment, the support column HR for preventing the collapse of the stacked wiring structure is formed in the same process as the insulation plug 30. Thereby, it is possible to prevent an increase in new processes for forming the support columns HR provided in the present embodiment. Furthermore, the process of forming the support columns, which is usually provided, can be eliminated. The support columns HR are provided in order to prevent a phenomenon in which the cavity of the word line wiring layer, which may occur in the replacement process of the word lines WL, collapses.

2. Second Embodiment

Next, the semiconductor storage device of the second embodiment will be described. In the first embodiment, the structure, in which the contact plug hole CCA is emptied until reaching the insulating layer 31 in the process of forming the contact plug hole CCA of FIG. 27 for forming the contact plug CC, has been described. In the second embodiment, a structure will be described in which the contact plug hole CCA does not reach the insulating layer 31 and is empty in the middle of the silicon layer 64 in the process of forming the contact plug hole CCA. The circuit configuration and the planar layout of the semiconductor storage device of the second embodiment are the same as those of the first embodiment. The second embodiment will mainly describe differences from the first embodiment.

2.1 Cross-Sectional Structure of Semiconductor Storage Device

Figure 33:
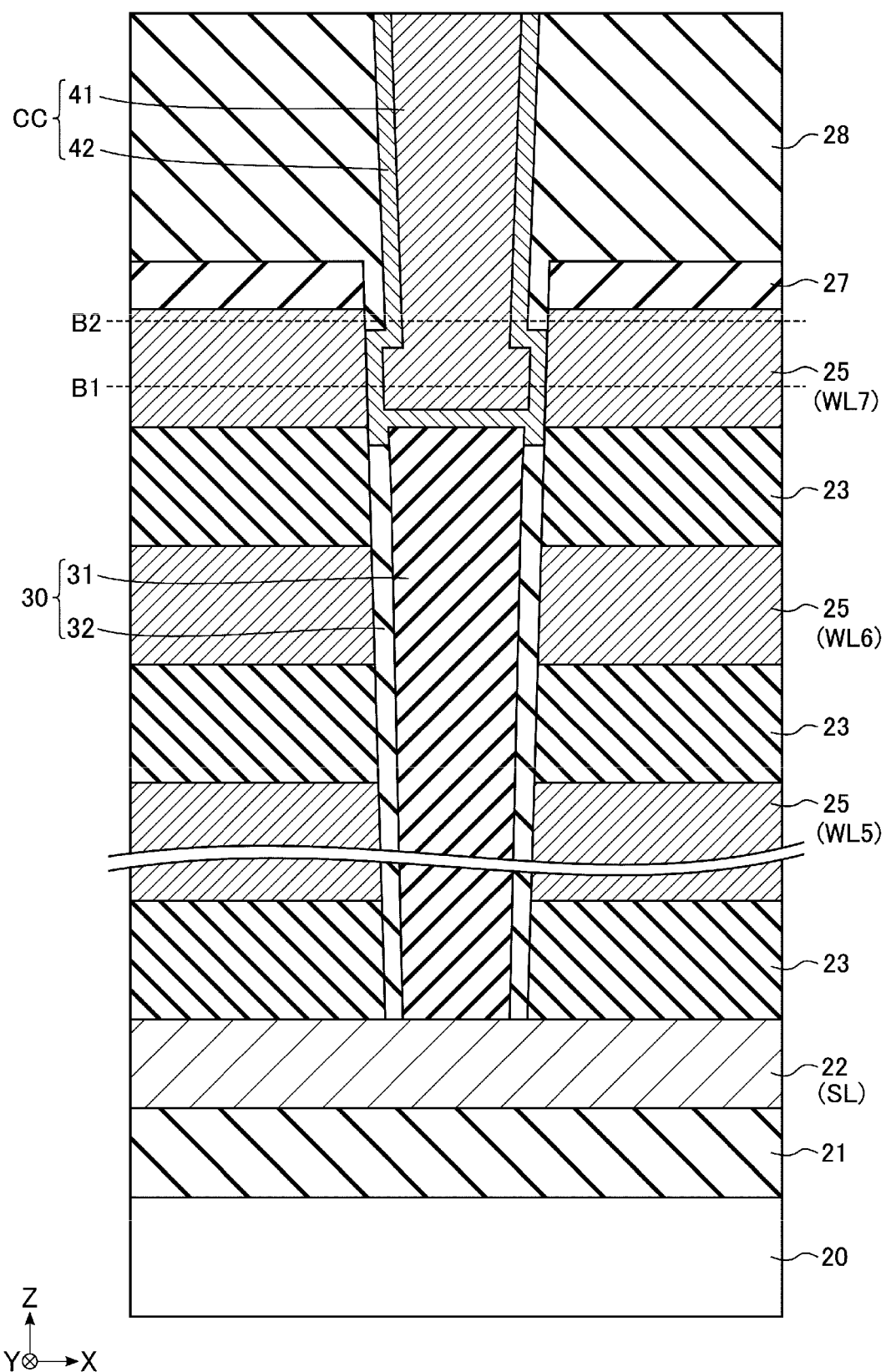
FIG. 33 is a cross-sectional view of a contact plug and an insulation plug in the semiconductor storage device of the second embodiment.

The cross-sectional structure of the contact plug CC in the hook-up area HA of the semiconductor storage device 1 of the second embodiment will be described. FIG. 33 is a cross-sectional view of the contact plug CC and the insulation plug 30 in the hook-up area HA of the semiconductor storage device 1.

As shown in FIG. 33, the bottoms of the conductive layers 41 and 42 do not enter the upper part of the insulating layer 31, and the lower surface of the conductive layer 42 is disposed at substantially the same height as the upper surface of the insulating layer 23 as the uppermost layer. The conductive layer 41 is disposed on the conductive layer 42. In the cross section of the broken line B1 parallel to the XY plane shown in FIG. 33, the conductive layer 42 has a first diameter at the height of the central portion of the conductive layer 25 as the uppermost layer for each terrace area. In the cross section of the broken line B2 parallel to the XY plane shown in FIG. 33, the conductive layer 42 has a second diameter smaller than the first diameter above the central portion of the conductive layer 25 as the uppermost layer in each terrace area.

In the area where the insulation plug 30 and the contact plug CC come into contact with each other, the contact plug CC has a first portion that has a surface along the X direction and a second portion that is stretched from the first portion in the Z direction and extends to the outer peripheral portion of the insulation plug 30.

2.2 Method of Manufacturing Semiconductor Storage Device

Next, a method of manufacturing the contact plug CC in the semiconductor storage device 1 of the second embodiment will be described. FIGS. 34 to 37 are cross-sectional views of each process showing the method of manufacturing the contact plug CC in the semiconductor storage device. Similarly to the first embodiment, FIGS. 34 to 37 show the process of manufacturing the contact plugs CC connected to the select gate line SGD and the word lines WL7 and WL6, where the process of manufacturing the other contact plugs CC, the word lines WL0 to WL4, the semiconductor substrate 20, the insulating layer 21, the conductive layer 22, and the like are omitted.

The manufacturing process of FIGS. 9 to 26 is the same as that of the first embodiment. That is, the manufacturing process shown in FIGS. 9 to 26 is performed to form the insulating layer 31, the silicon layer 64, and the insulating layer 28 in the insulation plug hole 30A. Further, the word line WL replacement process for replacing the insulating layer 61 with the conductive layers 26, 25, 24 is performed.

Figure 34:
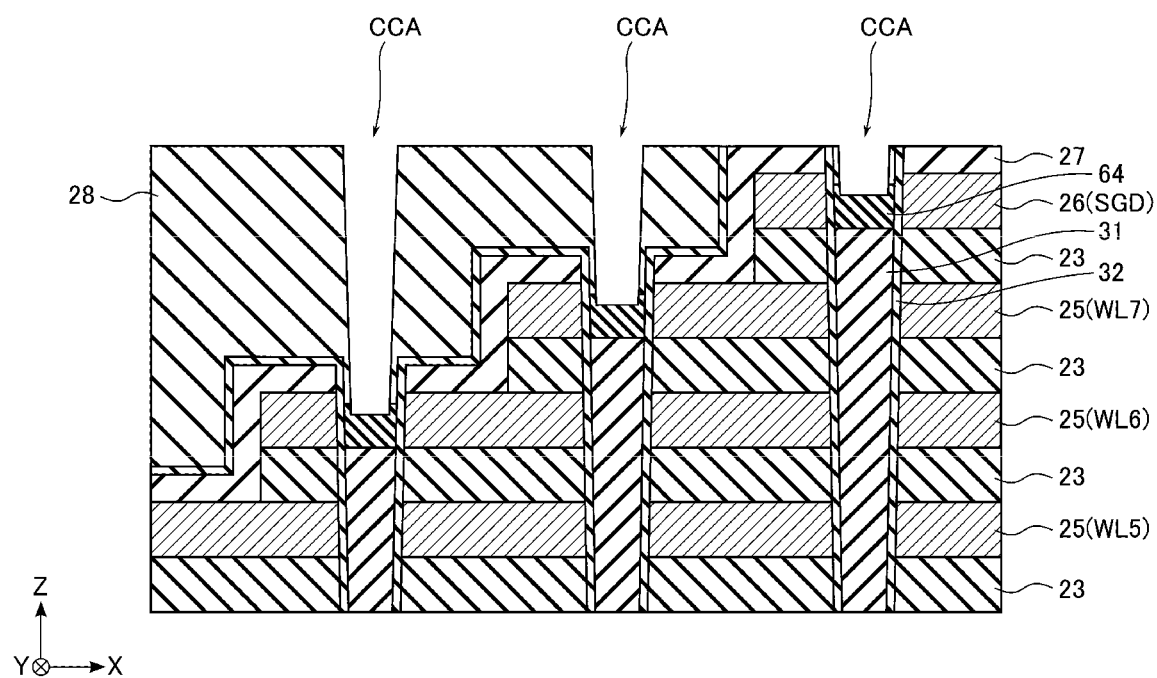
FIG. 34 is a cross-sectional view showing the method of manufacturing the semiconductor storage device of the second embodiment.

Next, as shown in FIG. 34, the insulating layer 28 in the insulation plug hole 30A is removed by, for example, the RIE method, and further, the silicon layer 64 is removed up to the middle of the silicon layer 64, thereby forming the hole CCA for the contact plug CC.

Figure 35:
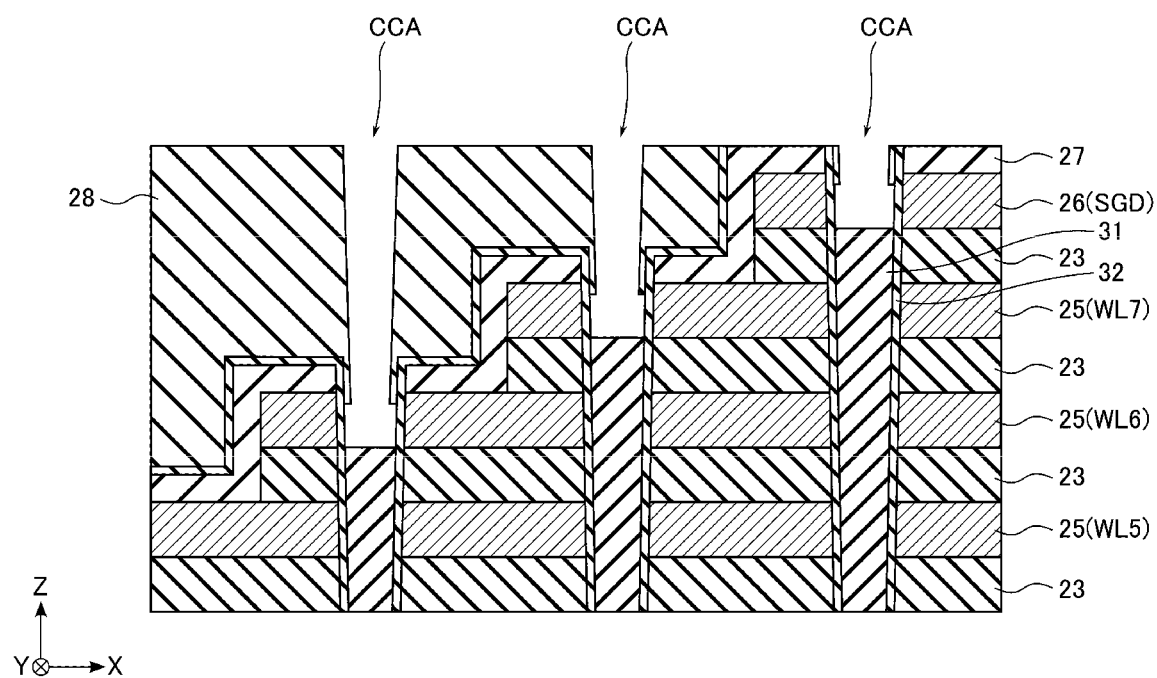
FIG. 35 is a cross-sectional view showing the method of manufacturing the semiconductor storage device of the second embodiment.
Figure 36:
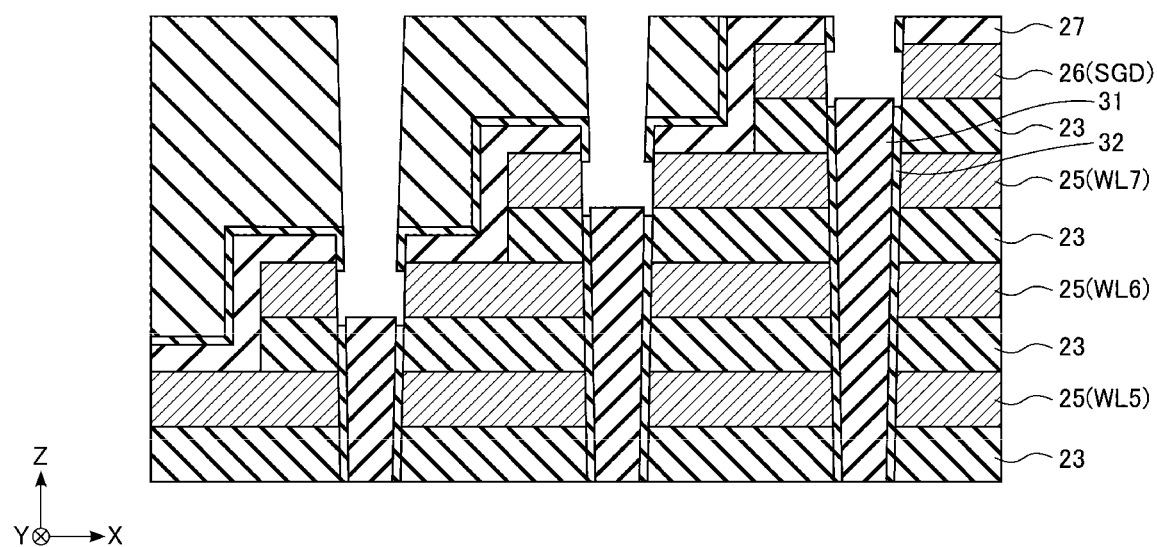
FIG. 36 is a cross-sectional view showing the method of manufacturing the semiconductor storage device of the second embodiment.

Next, as shown in FIG. 35, the silicon layer 64 at the bottom inside the contact plug hole CCA is removed. Further, as shown in FIG. 36, the insulating layer 32 on the side surface of the conductive layer 26 or 25 in the contact plug hole CCA is removed, thereby exposing the side surface of the conductive layer 26 or 25.

Figure 37:
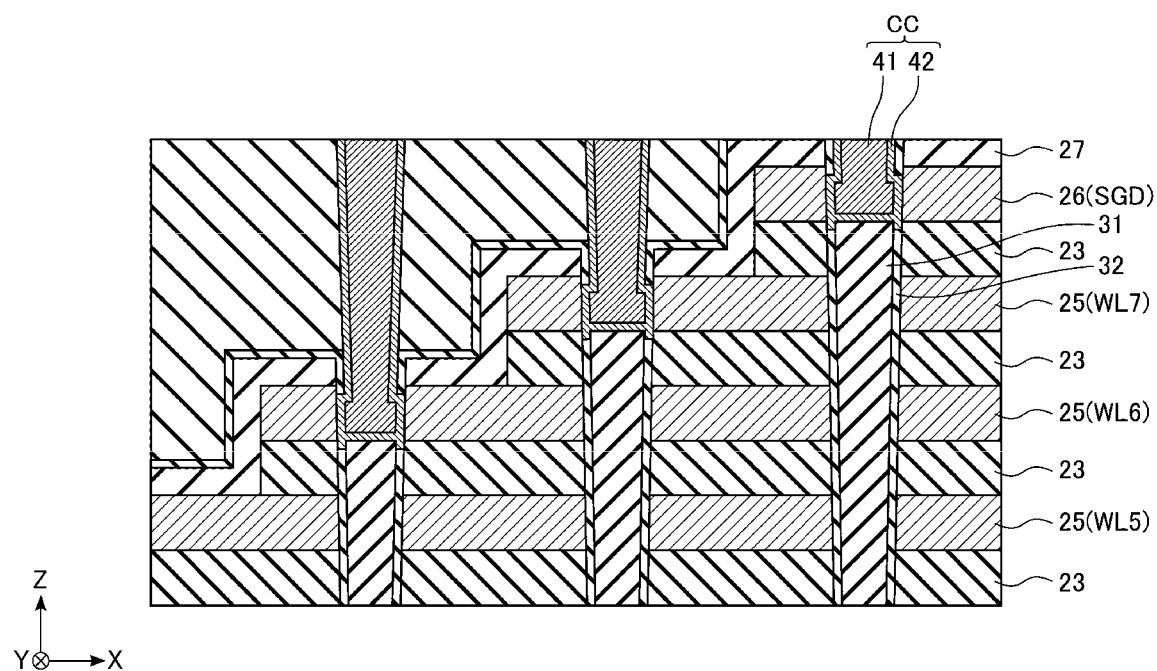
FIG. 37 is a cross-sectional view showing the method of manufacturing the semiconductor storage device of the second embodiment.

Next, as shown in FIG. 37, a conductive layer 42 is formed on the inner wall of the contact plug hole CCA. That is, the conductive layer 42 as a barrier metal is formed on the exposed side surface of the conductive layer 26 or 25 in the contact plug hole CCA and the side surface of the insulating layer 28. Next, the conductive layer 41 is formed on the conductive layer 42 and the insulating layers 27 and 28 in the contact plug hole CCA by, for example, a CVD method (or an ALD method). Further, the conductive layer 41 formed above the contact plug hole CCA and on the insulating layers 27 and 28 is planarized by, for example, the CMP method.

Via the above processes, the contact plug CC is manufactured in the hook-up area HA of the semiconductor storage device 1.

2.3 Effects of Second Embodiment

According to the second embodiment, it is possible to improve the operational reliability of the semiconductor storage device, as in the first embodiment.

3. Other Modifications

Although the NAND flash memory has been described as an example of the semiconductor storage device in the above-described embodiments, the disclosure is not limited to the NAND flash memory, but may be applied to other semiconductor memories and may be further applied to various memory devices other than the semiconductor memory. Further, in the flowchart described in the above embodiment, the order of the processes may be changed as much as possible.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor storage device comprising:
   forming a stacked body on a substrate by alternately stacking a first film and a second film;
   forming a stepwise manner in an area of the stacked body;
   forming a first hole penetrating the stack body in the area;
   forming a first insulating film along an inner wall of the first hole;
   embedding a second insulating film in the first hole;
   etching back the second insulating film to a first height;
   embedding a third film on the second insulating film in the first hole;
   etching back the third film to a second height higher than the first height;
   forming a second hole in the first hole by removing the third film partially;
   removing the third film in the first hole to enhance the second hole;
   removing a part of the first insulating film in the first hole to enhance the second hole further; and
   forming a conductive plug in the further enhanced second hole.

2. The method according to claim 1, further comprising:
removing the second film to form a cavity; and
forming a first conductive film in the cavity,
wherein the conductive plug contacts the first conductive film.

3. The method according to claim 1, further comprising:
forming the second hole to penetrate the third film.

4. The method according to claim 1, further comprising:
forming the second hole shallower than a lower face of the third film.

5. The method according to claim 1, further comprising:
embedding the second insulating film in the first hole, while forming a support column.

6. The method according to claim 1, wherein
a diameter of the first hole is longer than a diameter of the second hole.

7. The method according to claim 1, wherein
the first insulating film is thinner than the second insulating film.

8. The method according to claim 1, wherein
a first height is substantially a same as a height of a boundary between an uppermost first film and an uppermost second film.

9. The method according to claim 1, wherein
a second height is same as or lower than an upper face of the uppermost second film.

10. The method according to claim 1, wherein
the part of the first insulating film has substantially a same height as the uppermost second film.

11. The method according to claim 1, further comprising:
forming a silicon layer in the first hole; and
removing the silicon layer in the first hole.

12. The method according to claim 1, wherein
the first insulating film is formed of silicon oxide.

13. The method according to claim 1, wherein
the second insulating film is formed of silicon nitride, silicon carbonitride or silicon carbide.

14. The method according to claim 1, wherein
the third film is formed of silicon.

15. The method according to claim 1, wherein
forming the conductive plug in the further enhanced second hole includes:
forming a barrier metal layer, and
forming a metal layer.

16. The method according to claim 15, wherein
the barrier metal layer is formed of titanium nitride, and
the metal layer is formed of tungsten.

17. A method for manufacturing a semiconductor storage device comprising:
forming a stacked body on a substrate by alternately stacking a first film and a second film;
forming a stepwise manner in an area of the stacked body;
forming a first hole penetrating the stack body in the area;
forming a first insulating film along an inner wall of the first hole;
embedding a second insulating film in the first hole;
etching back the second insulating film to a first height;
embedding a third film on the second insulating film in the first hole;
etching back the third film to a second height higher than the first height;
forming a second hole in the first hole by removing the third film partially;
removing the third film, at least partially, in the first hole to enhance the second hole; and
removing a part of the first insulating film in the first hole to enhance the second hole further,
wherein the second hole is shallower than a lower face of the third film at a timing of said forming the second hole.

18. The method according to claim 17, further comprising:
forming a silicon layer in the first hole; and
removing the silicon layer in the first hole.

19. The method according to claim 17, wherein
the second insulating film is formed of silicon nitride, silicon carbonitride or silicon carbide.

20. The method according to claim 17, wherein
the third film is formed of silicon.

* * * * *